(12) United States Patent
Hong et al.

(10) Patent No.: US 11,658,141 B2
(45) Date of Patent: *May 23, 2023

(54) DIE-TO-WAFER BONDING STRUCTURE AND SEMICONDUCTOR PACKAGE USING THE SAME

(71) Applicant: Samsung Electronics Co., Ltd., Suwon-si (KR)

(72) Inventors: Jiseok Hong, Yongin-si (KR); Unbyoung Kang, Hwaseong-si (KR); Myungsung Kang, Yongin-si (KR); Taehun Kim, Asan-si (KR); Sangcheon Park, Hwaseong-si (KR); Hyuekjae Lee, Hwaseong-si (KR); Jihwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/680,477

(22) Filed: Feb. 25, 2022

(65) Prior Publication Data

US 2022/0181285 A1    Jun. 9, 2022

Related U.S. Application Data

(63) Continuation of application No. 16/985,445, filed on Aug. 5, 2020, now Pat. No. 11,289,438.

(30) Foreign Application Priority Data

Oct. 7, 2019 (KR) .......................... 10-2019-0123973

(51) Int. Cl.
*H01L 23/48* (2006.01)
*H01L 23/52* (2006.01)
(Continued)

(52) U.S. Cl.
CPC .............. *H01L 24/08* (2013.01); *H01L 22/22* (2013.01); *H01L 24/05* (2013.01); *H01L 24/06* (2013.01);
(Continued)

(58) Field of Classification Search
CPC combination set(s) only.
See application file for complete search history.

(56) References Cited

U.S. PATENT DOCUMENTS 5,754,410 A * 5/1998 Bardsley ................. H01L 22/32
361/780
8,242,610 B2 8/2012 Yamaguchi et al.
(Continued)

FOREIGN PATENT DOCUMENTS

| JP | 5353237 B2 | 11/2013 |
| KR | 10-2008-0084921 A | 9/2008 |
| KR | 10-1947251 B1 | 2/2019 |

OTHER PUBLICATIONS

European Search Report for corresponding EP Patent Application No. 20184822.3, dated Jan. 15, 2021.

*Primary Examiner* — Niki H Nguyen
(74) *Attorney, Agent, or Firm* — Muir Patent Law, PLLC

(57) ABSTRACT

According to an aspect of the inventive concept, there is provided a die-to-wafer bonding structure including a die having a first test pad, a first bonding pad formed on the first test pad, and a first insulating layer, the first bonding pad penetrates the first insulating layer. The structure may further include a wafer having a second test pad, a second bonding pad formed on the second test pad, and a second insulating layer, the second bonding pad penetrates the second insulating layer. The structure may further include a polymer layer surrounding all side surfaces of the first bonding pad and all side surfaces of the second bonding pad, (Continued)

the polymer layer being arranged between the die and the wafer. Additionally, the wafer and the die may be bonded together.

20 Claims, 14 Drawing Sheets

(51) Int. Cl.
    *H01L 29/40*     (2006.01)
    *H01L 23/00*     (2006.01)
    *H01L 21/66*     (2006.01)
    *H01L 25/065*     (2023.01)
    *H01L 25/00*     (2006.01)

(52) U.S. Cl.
    CPC .............. *H01L 24/29* (2013.01); *H01L 24/32* (2013.01); *H01L 24/92* (2013.01); *H01L 25/0657* (2013.01); *H01L 25/50* (2013.01); *H01L 23/481* (2013.01); *H01L 2224/05124* (2013.01); *H01L 2224/05564* (2013.01); *H01L 2224/05647* (2013.01); *H01L 2224/06051* (2013.01); *H01L 2224/08145* (2013.01); *H01L 2224/2919* (2013.01); *H01L 2224/29028* (2013.01); *H01L 2224/32145* (2013.01); *H01L 2224/9211* (2013.01)

(56) References Cited

U.S. PATENT DOCUMENTS

| | | | |
|---|---|---|---|
| 8,558,229 B2 | 10/2013 | Jeng et al. | |
| 9,461,007 B2 | 10/2016 | Chun et al. | |
| 9,496,189 B2* | 11/2016 | Yu | H01L 22/20 |
| 9,893,028 B2 | 2/2018 | Yu et al. | |
| 10,163,859 B2 | 12/2018 | Yu et al. | |
| 11,289,438 B2* | 3/2022 | Hong | H01L 25/50 |
| 2007/0080360 A1 | 4/2007 | Mirsky et al. | |
| 2013/0077272 A1* | 3/2013 | Lin | H01L 22/32 |
| | | | 174/257 |
| 2017/0018525 A1 | 1/2017 | Dias et al. | |
| 2019/0131277 A1 | 5/2019 | Yang et al. | |
| 2019/0164867 A1 | 5/2019 | Hu et al. | |
| 2019/0252338 A1* | 8/2019 | Chandolu | H01L 24/03 |
| 2019/0363068 A1* | 11/2019 | Hotta | H01L 24/80 |

\* cited by examiner

DIE-TO-WAFER BONDING STRUCTURE AND SEMICONDUCTOR PACKAGE USING THE SAME

CROSS-REFERENCE TO RELATED APPLICATION

This application is a continuation of and claims priority to U.S. patent application Ser. No. 16/985,445 filed Aug. 5, 2020, which claims priority to and the benefit of Korean Patent Application No. 10-2019-0123973, filed on Oct. 7, 2019, in the Korean Intellectual Property Office, the disclosures of which are incorporated herein in their entirety by reference.

BACKGROUND

The inventive concept relates to a die-to-wafer bonding structure and a semiconductor package using the same, and more particularly, to a die-to-wafer bonding structure including a polymer layer and a semiconductor package using the die-to-wafer bonding structure.

Recently, electronic devices have become more compact and lighter according to rapid development of the electronics industry and demands of users. For semiconductor packages used in the electronic devices, high performance and large capacity are required along with miniaturization and light weight. In response to the requirements, to realize the high performance and large capacity along with the miniaturization and light weight, research and development on a semiconductor package in which a plurality of semiconductor dies are bonded have been continuously performed.

SUMMARY

The inventive concept provides a die-to-wafer bonding structure having excellent bonding reliability between bonding pads that are directly bonded (direct bonding), and a semiconductor package using the die-to-wafer bonding structure.

The problems to be solved by the technical idea of the inventive concept are not limited to the above-mentioned issues, and other matters not mentioned may be clearly understood by those of ordinary skill in the art from the following description.

According to an aspect of the inventive concept, there is provided a die-to-wafer bonding structure including a die having a first test pad, a first bonding pad formed on the first test pad, and a first insulating layer, the first bonding pad penetrates the first insulating layer. The structure may further include a wafer having a second test pad, a second bonding pad formed on the second test pad, and a second insulating layer, the second bonding pad penetrates the second insulating layer. The structure may further include a polymer layer surrounding all side surfaces of the first bonding pad and all side surfaces of the second bonding pad, the polymer layer being arranged between the die and the wafer. Additionally, the wafer and the die may be bonded together.

According to another aspect of the inventive concept, there is provided a die-to-wafer bonding structure including a die having a first integrated circuit layer on a first substrate, a first metal wiring layer connected to the first integrated circuit layer, a plurality of first test pads on the first metal wiring layer, a first insulating layer, and a plurality of first bonding pads formed on the plurality of first test pads, the plurality of first bonding pads penetrating the first insulating layer. The structure may further include a wafer having a second integrated circuit layer on a second substrate, a second metal wiring layer connected to the second integrated circuit layer, a plurality of second test pads on the second metal wiring layer, a second insulating layer, and a plurality of second bonding pads formed on the plurality of second test pads, the plurality of second bonding pads penetrating the second insulating layer. The structure may further include a polymer layer surrounding all side surfaces of the first bonding pad and all side surfaces of the second bonding pad, the polymer layer being arranged between the die and the wafer. Additionally, an uneven portion may be formed on a surface of at least one first test pad of the plurality of first test pads, and the plurality of first bonding pads and the plurality of second bonding pads face each other and are bonded to each other.

According to another aspect of the inventive concept, there is provided a semiconductor package including a first metal wiring layer on a first substrate, a first test pad on the first metal wiring layer, a first insulating layer on the first test pad, a polymer layer on the first test pad and the first insulating layer, a second insulating layer on the polymer layer, a second test pad on the polymer layer and the second insulating layer. The structure may further include a second metal wiring layer on the second test pad, a second substrate on the second metal wiring layer, and a bonding pad penetrating the polymer layer and connecting the first and second test pads, the bonding pad being surrounded by the polymer layer.

According to another aspect of the inventive concept, there is provided a manufacturing method of a semiconductor package, the method including preparing a first wafer comprising a first metal wiring layer on a first substrate, a first test pad on the first metal wiring layer, and a first insulating layer on the first test pad, the first wafer comprising a plurality of individual dies. The method may further include patterning the first insulating layer to expose a top surface of the first test pad, performing a test by contacting the exposed first test pad with a test pin of a test device, forming a mask pattern on the first insulating layer and the first test pad, and forming a first bonding pad on a surface of the first test pad on which the mask pattern is not formed. The method may further include removing the mask pattern, forming a first polymer layer covering all of the first insulating layer, the first test pad, and the first bonding pad, exposing the first bonding pad by polishing the first polymer layer, separating a first wafer into individual dies by cutting the first wafer, and bonding the dies that have been separated to a second wafer. Additionally, each die may include at least one first bonding pad.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
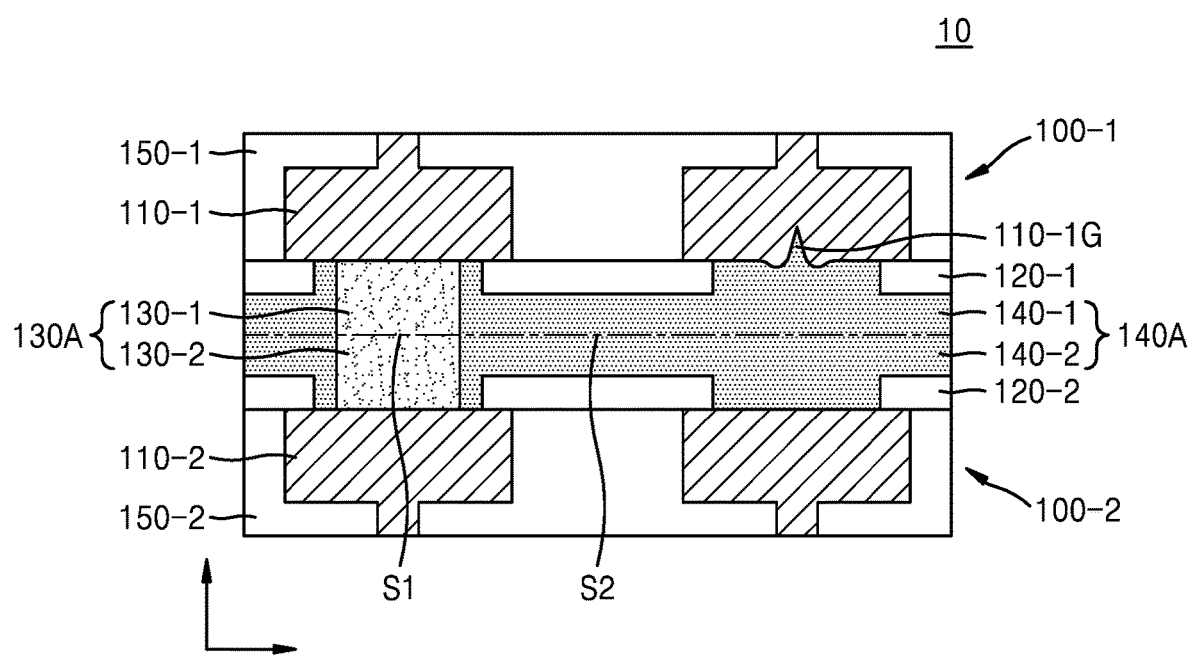
FIG. 1 is a cross-sectional view illustrating a bonded portion of a die-to-wafer bonding structure, according to an embodiment of the inventive concept.

FIG. 1 is a cross-sectional view illustrating a bonded portion of a die-to-wafer bonding structure 10, according to an embodiment of the inventive concept.

Referring to FIG. 1, the die-to-wafer bonding structure 10 may have a structure in which a die 100-1 is bonded to a wafer 100-2.

The die 100-1 may refer to an individual semiconductor die or an individual semiconductor chip. The die 100-1 may include a first test pad 110-1, a first insulating layer 120-1, a first bonding pad 130-1, a first polymer layer 140-1, and an interlayer insulating layer 150-1. For convenience of description, a surface where the die 100-1 contacts the wafer 100-2 may be referred to as a top surface of the die 100-1, and a surface of the die 100-1 that is opposite the top surface of the die 100-1 may be referred to as a bottom surface of the die 100-1. For example, a top surface of the die 100-1 may contact the wafer 100-2 and a bottom surface of the die 100-1 may be opposite the top surface of the die 100-1 and not be in direct contact with the wafer 100-2. Additionally, the top surface and bottom surface may extend in the horizontal direction.

The wafer 100-2 may refer to a substrate in which a plurality of semiconductor dies are not individually separated or a substrate in which a plurality of semiconductor chips are not individually separated. For example, the wafer may comprise a substrate on which a plurality of semiconductor dies and/or a plurality of semiconductor chips are disposed. The wafer 100-2 may include a second test pad 110-2, a second insulating layer 120-2, a second bonding pad 130-2, a second polymer layer 140-2, and a second interlayer insulating layer 150-2. For convenience of description, a surface where the wafer 100-2 contacts the die 100-1 may be referred to as a top surface of the wafer 100-2, and a surface of the wafer 100-2 that is opposite the top surface of the wafer 100-2 may be referred to as a bottom surface of the wafer 100-2. For example, a top surface of the wafer 100-2 may contact the die 100-1 and a bottom surface of the wafer 100-2 may be opposite the top surface of the wafer 100-2 and not be in direct contact with the die 100-1.

It will be understood that when an element is referred to as being in "contact" with another element, it can be directly contacting, connected, or coupled to or on the other element or intervening elements may be present. In contrast, when an element is referred to as being in "direct contact" with another element, there are no intervening elements present.

The first test pad 110-1 may have a dual damascene pattern, for example. The dual damascene pattern may be a pattern having a structure of a narrow bottom and a wide top and may be formed by a dual damascene process. A material constituting the first test pad 110-1 may include aluminum (Al), for example. A material constituting the first test pad 110-1 may include a metal having a relatively low hardness and strength as compared with a material constituting the first bonding pad 130-1. The top surface of the first test pad 110-1 may have, for example, a rectangular shape. However, a shape of the top surface of the first test pad 110-1 may not be limited to the rectangular shape. For example, the top surface of the first test pad 110-1 may have various shapes such as a circular shape, an elliptic shape, and a polygonal shape.

The first test pad 110-1 may be configured in plural, e.g., a plurality of first test pads 110-1. The first bonding pads 130-1 may be formed on a portion (or sub-group) of the plurality of first test pads 110-1, and the first bonding pads 130-1 may not be formed on the remaining portions of the plurality of first test pads 110-1. For example, first bonding pads 130-1 may be formed only on a sub-group of the plurality of first test pads 110-1, and may not be formed on each bonding pad of the plurality of first bonding pads 130-1. The first insulating layer 120-1, the first bonding pad 130-1, and the first polymer layer 140-1 may be in contact with the top surface of the first test pad 110-1 on which the first bonding pad 130-1 is formed. In addition, the first insulating layer 120-1 and the first polymer layer 140-1 may be in contact with the top surface of the first test pad 110-1 on which the first bonding pad 130-1 is not formed.

When viewed from a side view, the maximum width of the first test pad 110-1 in the horizontal direction may be greater than the maximum width of the first bonding pad 130-1 in the horizontal direction. In addition, when viewed in a plan view, a surface area of the first test pad 110-1 may be greater than a surface area of the first bonding pad 130-1.

The first insulating layer 120-1 may include silicon oxide, silicon nitride, and/or silicon oxynitride, for example. The first insulating layer 120-1 may include a single layer of a single material, or may include plural layers of different materials. For example, when the first insulating layer 120-1 includes plural layers, the first insulating layer 120-1 may include a first silicon carbon nitride (SiCN) layer, a tetraethyl orthosilicate (TEOS) layer, and a second SiCN layer. In addition, the first insulating layer 120-1 may include a first SiCN layer, a first TEOS layer, a second SiCN layer, and a second TEOS layer.

The first bonding pad 130-1 may be arranged on some of the plurality of first test pads 110-1. The first bonding pad 130-1 may be arranged, without passing through a vertical contact, to have the bottom surface of the first bonding pad 130-1 in contact with the top surface of the first test pad 110-1. For example, a bottom surface of the first bonding pad 130-1 may be in direct contact with the top surface of the first test pad 110-1. In addition, all of the side surfaces of the first bonding pad 130-1 may be surrounded by the first polymer layer 140-1.

The first bonding pad 130-1 may be formed by, for example, a plating process or a physical vapor deposition (PVD) process. The first bonding pad 130-1 may have, for example, a cylindrical shape. However, the shape of the first bonding pad 130-1 is not limited thereto. For example, the first bonding pad 130-1 may have various shapes such as an elliptical pillar, a square pillar, and a polygonal pillar.

The first bonding pads 130-1 may have various sizes. For example, the width of the first bonding pad 130-1 in the horizontal direction may be about 1 μm to about 20 μm. A thickness of the first bonding pad 130-1 in the vertical direction may be about 15% to about 50% of the width thereof, for example. In addition, as the width of the first bonding pad 130-1 increases, a ratio of the thickness over the width may relatively decrease. For example, when the width of the first bonding pad 130-1 is about 1 μm, the thickness thereof may be about 1 μm to about 201 μm. When the width of the first bonding pad 130-1 is about 201 μm, the thickness thereof may be about 31 μm to about 51 μm. Of course, the width and thickness of the first bonding pad 130-1 are not limited to the above values.

The first polymer layer 140-1 may be formed on the first test pad 110-1 and the first insulating layer 120-1 and may have a structure that surrounds side surfaces of the first bonding pad 130-1. The first polymer layer 140-1 may have a structure surrounding all of the side surfaces and the top surface of the first insulating layer 120-1 and the side surfaces of the first bonding pad 130-1. In addition, a top surface S1 of the first bonding pad 130-1 may be coplanar with a top surface S2 of the first polymer layer 140-1.

The first polymer layer 140-1 may include a polymer material having relatively high heat resistance and high bonding strength, for example. The first polymer layer 140-1 may include a material that is easily reflowed by heat treatment, or is easily combined with another polymer, for example, the second polymer layer 140-2 of the wafer 100-2, by heat treatment. In addition, the first polymer layer 140-1 may include a material that is cured by heat treatment, and maintains a strong bonding force due to the curing.

In some embodiments, the first polymer layer 140-1 may include any one of, for example, polyimide, polyamide, polyacrylrate, and polyaramide. Of course, the material of the first polymer layer 140-1 is not limited thereto. In other embodiments, when the first polymer layer 140-1 has the above-described characteristics, for example, heat-resistant, reflowable, higher bonding strength through curing, and the like, the first polymer layer 140-1 may include other types of materials other than the above materials.

Structure, material, and the like of elements constituting the wafer 100-2 may be substantially the same or similar as the structure, the material, and the like of elements constituting the die 100-1 described above. Thus, detailed descriptions of the wafer 100-2 are omitted.

In some embodiments, a first test pad 110-1 may include some other characteristics in comparison with the second test pad 110-2. An uneven portion 110-1G (a non-planar portion) may be formed in at least one of the first test pads 110-1. For example, as illustrated by FIG. 1, a left first test pad 110-1 (labelled) and a right first test pad 110-1 (not labeled) are shown and the uneven portion 110-1G may correspond to a protrusion and/or recess (outdent and/or indent) that are non-planar and are also not co-planar with the other test pad 110-1. For example still, a right first test pad 110-1 (not labelled) is not co-planar with the left first test pad 110-1 (labelled). The uneven portion 110-1G of the first test pad 110-1 may be formed by a test process for screening the die 100-1. The test process may be performed to verify function(s) and electrical connection(s) of the die 100-1. The test process may be performed by physically contacting a test pin (see TP in FIG. 8C) of a test apparatus (see TA in FIG. 8C) with the first test pad 110-1. A contact test process may have a relatively high test performance compared with a non-contact test process, and therefore a contact test process may have advantages over a non-contact test process. However, like the uneven portion 110-1G of the first test pad 110-1, a shape that lowers surface uniformity may be accompanied by a non-contact test process.

Although the first bonding pad 130-1 and the second bonding pad 130-2, and the first polymer layer 140-1 and the second polymer layer 140-2 are distinguished from each other by a dashed-dotted line in FIG. 1, the illustration is intended to show that the first bonding pad 130-1 and the first polymer layer 140-1 originate from the die 100-1, and the second bonding pad 130-2 and the second polymer layer 140-2 originate from the wafer 100-2. Therefore, those with skill in the art will understand that the first bonding pad 130-1 and the second bonding pad 130-2 may be bonded to each other to form an integrated bonding pad 130A, and the first polymer layer 140-1 and the second polymer layer 140-2 may be bonded to each other to form a polymer layer 140A of an integral configuration.

The die-to-wafer bonding structure 10 may have a structure in which the die 100-1 and the wafer 100-2 are bonded to each other by heat treatment. For example, by bonding, using heat treatment, the first bonding pad 130-1 and the second bonding pad 130-2, and bonding, using heat treatment, the first polymer layer 140-1 and the second polymer layer 140-2. Here, the heat treatment may be performed at a temperature at which a bonding coupling between the first bonding pad 130-1 and the second bonding pad 130-2 is formed. In some embodiments, the heat treatment temperature may be about 180° C. to about 300° C., for example.

As described above, the first polymer layer 140-1 and the second polymer layer 140-2 may fill unwanted voids due to their having fluidity through reflow when heated within a range of heat treatment temperatures disclosed above. Furthermore, since the first polymer layer 140-1 and the second polymer layer 140-2 maintain a strong bonding force due to curing by the heat treatment, a likelihood of a bonding failure (that may occur in the bonding between conventional silicon insulating layers) may be prevented and/or suppressed.

In addition, the first polymer layer 140-1 and the second polymer layer 140-2 may be cured by heat treatment to have a curing degree of about 90% or more. In general, the curing may mean that the polymer material is crystallized above a glass transition temperature. For example, the curing degree of about 90% or more may mean that about 90% or more of the polymer material is crystallized above the glass transition temperature, and according to the crystallization, a very strong bonding force may be maintained.

As a result, in the die-to-wafer bonding structure 10 according to the technical idea of the inventive concept, unwanted voids may be filled with the reflow of the polymer layer 140A, and a defect caused by this phenomenon may be prevented and/or suppressed. Further, by bonding the polymer layer 140A with the curing degree of about 90% or more, a very strong bonding force may be maintained. For example, when utilizing a reflow process that heats the first polymer layer 140-1 and second polymer layer 140-2 to the appropriate heat treatment temperature, a resulting polymer layer 140A may have a curing degree of about 90% or greater and therefore form a relatively strong bonding force between the die 100-1 and the wafer 100-2.

In addition, the die-to-wafer bonding structure 10 according to the technical idea of the inventive concept may form a bonding structure which is not affected by surface uniformity of the first test pad 110-1 and is reliable, by having the uneven portion 110-1G filled with a material of good fluidity like the first polymer layer 140-1. For example, when a test apparatus (see TA in FIG. 8C) causes an uneven portion 110-1G to be formed in a first test pad 110-1, the uneven portion 110-1G may be reliably filled by a reflow process as disclosed above.

Ultimately, the die-to-wafer bonding structure 10 according to the technical concept of the inventive concept may increase productivity and reliability of a semiconductor package, because a tested known good die (KGD) 100-1 can be mounted on the wafer 100-2 in a reliable bonding structure.

Figure 2A:
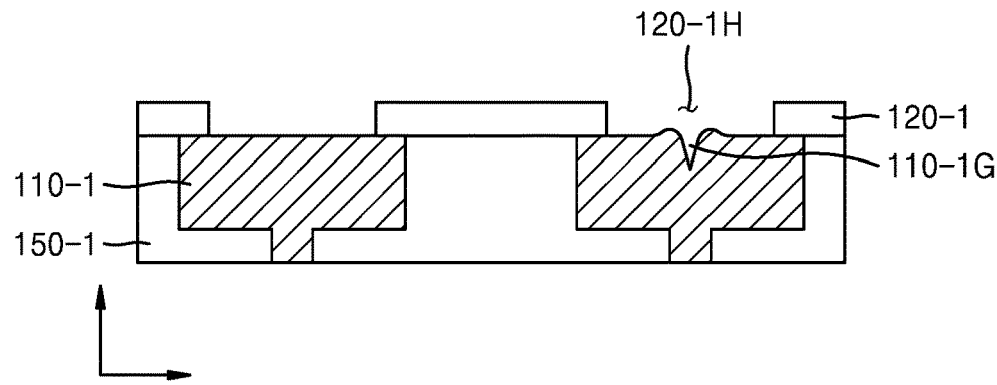
FIGS. 2A through 2C are cross-sectional views illustrating portions of a process of manufacturing the die-to-wafer bonding structure of FIG. 1.
Figure 2B:
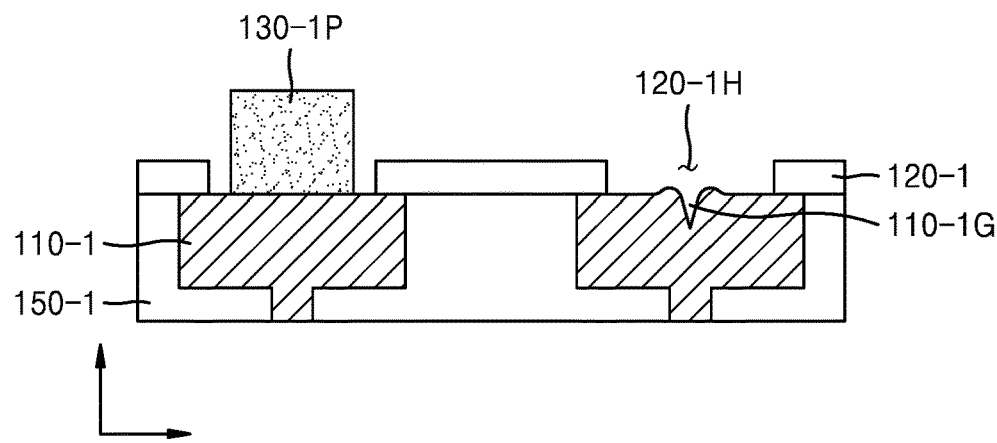
Figure 2C:
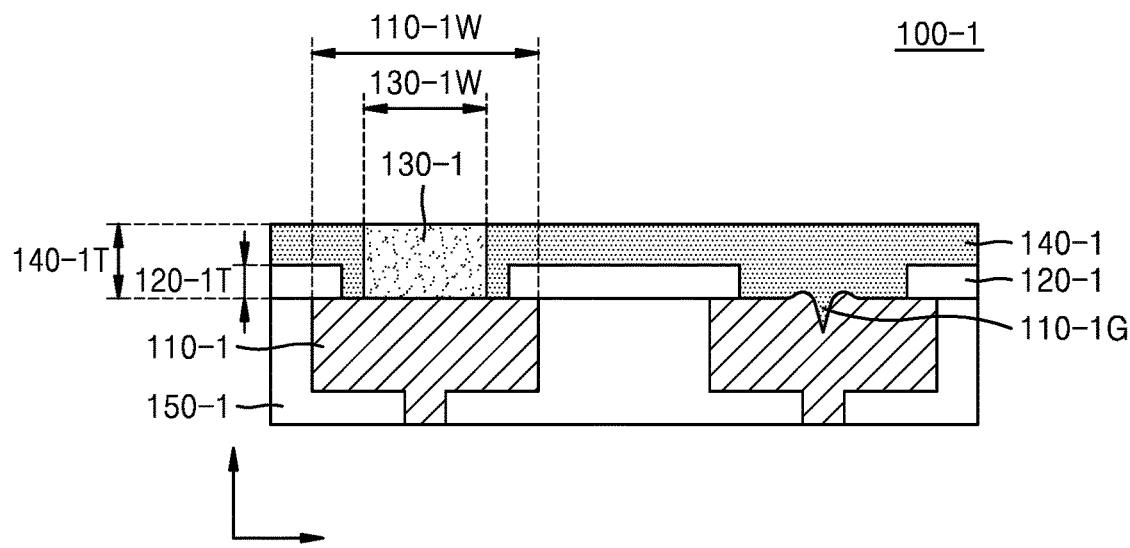

FIGS. 2A through 2C are cross-sectional views illustrating portions of a process of manufacturing the die-to-wafer bonding structure 10 of FIG. 1.

Referring to FIG. 2A, the first insulating layer 120-1 including a first opening 120-1H may be formed on the first interlayer insulating layer 150-1 and the first test pad 110-1.

After forming a preliminary insulating layer on the first interlayer insulating layer 150-1 and the first test pad 110-1, by patterning the preliminary insulating layer by a photo process and an etching process, the first insulating layer 120-1 having the first opening 120-1H exposing the central portion of the first test pad 110-1 may be formed.

The uneven portion 110-1G of the first test pad 110-1 may be formed in the test process for screening the die 100-1. The test process may be performed by physically contacting a test pin (see TP in FIG. 8C) of a test apparatus (see TA in FIG. 8C) with the first test pad 110-1. In this manner, like the uneven portion 110-1G of the first test pad 110-1, a shape that lowers surface uniformity may be accompanied.

Referring to FIG. 2B, a preliminary bonding pad 130-1P may be arranged on some of the plurality of first test pads 110-1.

The preliminary bonding pad 130-1P may be arranged such that a bottom surface thereof contacts the top surface of the first test pad 110-1. The preliminary bonding pad 130-1P may be formed only on the first test pads 110-1 that do not include the uneven portions 110-1G among the plurality of first test pads 110-1. For example, the preliminary bonding pads 130-1P may be formed only on the first test pads 110-1 where the test pins TP (see FIG. 8C) have not and/or will not contact the corresponding first test pad 110-1. For example still, the preliminary bonding pads 130-1P may only be formed on a sub-group of first test pads 110-1 that were not contacted and/or deformed by the test pins TP (see FIG. 8C) and may not be formed on the remaining first test pads 110-1 that were contacted and/or deformed by the test pins TP (see FIG. 8C).

The preliminary bonding pads 130-1P may be formed in, for example, a plating process or a physical vapor deposition (PVD) process. A material constituting the preliminary bonding pads 130-1P may include copper (Cu), for example. The material constituting the preliminary bonding pads 130-1P may include a metal having a relatively higher hardness and strength than the material constituting the first test pad 110-1.

The preliminary bonding pad 130-1P may have, for example, a cylindrical shape. A thickness of the preliminary bonding pads 130-1P in the vertical direction may be greater than the thickness of the first insulating layer 120-1 in the vertical direction. In addition, a width of the preliminary bonding pads 130-1P in the horizontal direction may be less than a width of the first opening 120-1H in the horizontal direction.

Referring to FIG. 2C, the first polymer layer 140-1 may be formed on the first insulating layer 120-1 and the first test pad 110-1 to cover the side surfaces of the first bonding pad 130-1.

The first polymer layer 140-1 may have a structure surrounding all of the side surfaces and the top surface of the first insulating layer 120-1 and the side surfaces of the first bonding pad 130-1. The structure may be to reduce defects that occur at contact areas between different materials by reducing the kind of material that comes into contact with the first bonding pad 130-1. In some embodiments, the first polymer layer 140-1 may not contact a top surface of the bonding pad 130-1.

The first polymer layer 140-1 may include a polymer material having relatively high heat resistance and high bonding strength. The first polymer layer 140-1 may include a material that is easily reflowed by heat treatment and in addition, is easily bonded to other polymer layers and/or materials by heat treatment. In addition, the first polymer layer 140-1 may include a material that is cured by heat treatment and maintains a strong bonding force due to the curing.

When viewed from a side view, a maximum width 110-1W of the first test pad 110-1 in the horizontal direction may be greater than a maximum width 130-1W of the first bonding pad 130-1 in the horizontal direction. In addition, when viewed in a plan view, a surface area of the first test pad 110-1 may be greater than a surface area of the first bonding pad 130-1. Accordingly, not only the first bonding pad 130-1 but also the first insulating layer 120-1 and the first polymer layer 140-1 may contact the top surface of the first test pad 110-1.

A thickness 120-1T of the first insulating layer 120-1 in the vertical direction may be about 0.5 $\mu$m to about 10 $\mu$m. In addition, a thickness 140-1T of the first polymer layer 140-1 in the vertical direction may be about 1 $\mu$m to about 20 $\mu$m. The thickness 140-1T of the first polymer layer 140-1 in the vertical direction may be about twice or more the thickness 120-1T of the first insulating layer 120-1 in the vertical direction. In some embodiments, an increase in an exposed surface of the first polymer layer 140-1 and an increase in the thickness thereof may be to intentionally maintain a strong bonding force in the die-to-wafer bonding structure 10. In addition, a thickness of the polymer layer 140A in the vertical direction may be about two times the thickness 140-1T of the first polymer layer 140-1 in the vertical direction and may be about 2 $\mu$m to about 40 $\mu$m.

In addition, the thickness 140-1T of the first polymer layer 140-1 in the vertical direction may be substantially the same as the thickness of the first bonding pad 130-1 in the vertical direction. For example, the top surface of the first polymer layer 140-1 may be coplanar with the top surface of the first bonding pad 130-1. This may be because the first polymer layer 140-1 is planarized with the first bonding pad 130-1.

By mounting the die 100-1 fabricated in this process on the wafer 100-2 (see FIG. 1) by direct bonding, the die-to-wafer bonding structure 10 according to an example embodiment of the inventive concept may be manufactured.

Figure 3:
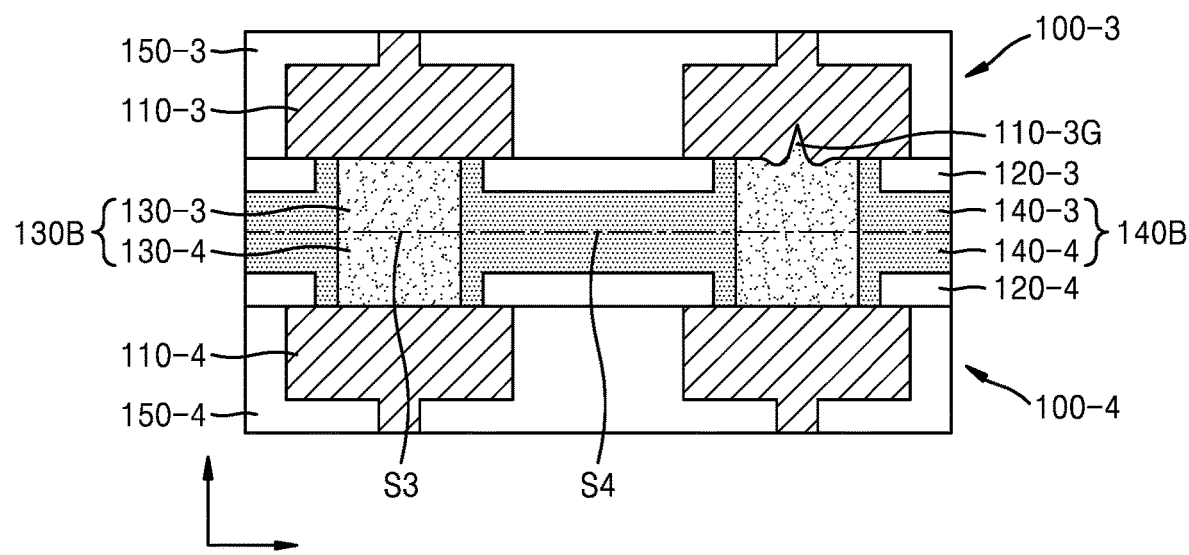
FIGS. 3 through 5 are cross-sectional views illustrating bonded portions of a die-to-wafer bonding structure, according to embodiments of the inventive concept.
Figure 4:
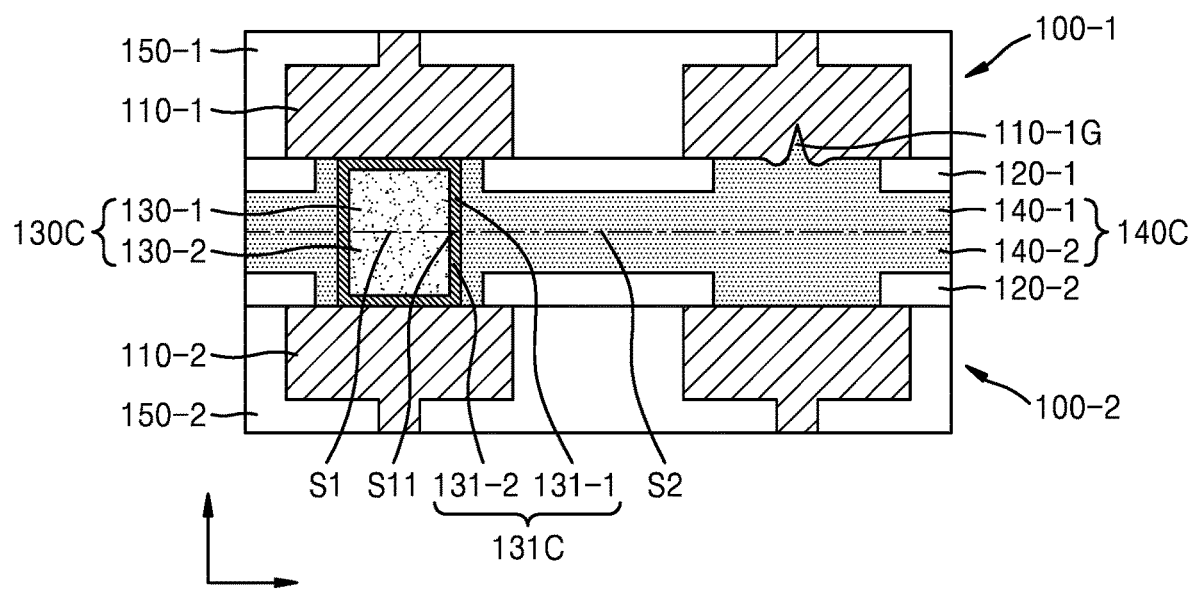
Figure 5:
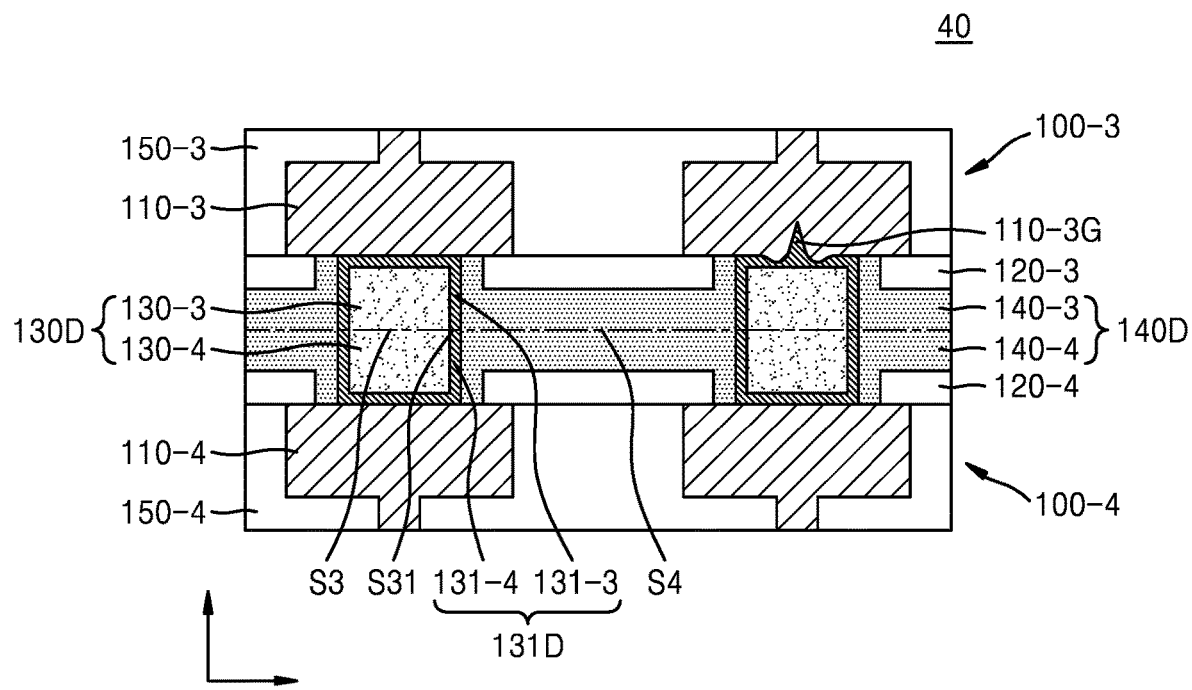

FIGS. 3 through 5 are various cross-sectional views illustrating bonded portions of the die-to-wafer bonding structure 10, according to example embodiments of the inventive concept.

Most of the components constituting each of the die-to-wafer bonding structures (20, 30, 40) and materials included in the components to be described below may be substantially the same as or similar to those described with reference to FIG. 1. Accordingly, for convenience of description, description focused on the differences from the die-to-wafer bonding structure 10 (refer to FIG. 1) described above are given.

Referring to FIG. 3, a die-to-wafer bonding structure 20 may have a structure in which a die 100-3 is bonded to a wafer 100-4.

The die 100-3 may include a third test pad 110-3, a third insulating layer 120-3, a third bonding pad 130-3, a third polymer layer 140-3, and a third interlayer insulating layer 150-3.

The third bonding pad 130-3 may be formed on all of a plurality of third test pads 110-3. For example, a third bonding pad 130-3 may be formed on each test pad of the plurality of third test pads 110-3. The third bonding pad 130-3 may be arranged such that a bottom surface of the third bonding pad 130-3 contacts a top surface of the third test pad 110-3. All side surfaces of the third bonding pad 130-3 may be surrounded by the third polymer layer 140-3.

The wafer 100-4 may have a configuration substantially the same as or similar to that of the die 100-3, and may include: a fourth test pad 110-4, a fourth insulating layer 120-4, a fourth bonding pad 130-4, a fourth polymer layer 140-4, and a fourth interlayer insulating layer 150-4.

In some embodiments, the third test pad 110-3 may include some other characteristics in comparison with the fourth test pad 110-4. For example, an uneven portion 110-3G may be formed in at least one of the third test pads 110-3. The uneven portion 110-3G of the third test pad 110-3 may be formed in a test process for screening the die 100-3 as explained hereinabove. In contrast, an uneven portion may not be formed in the fourth test pad 110-4.

The third bonding pad 130-3 may fill the uneven portion 110-3G of the third test pad 110-3. Accordingly, a surface profile of a bottom surface of the third bonding pad 130-3 (located on the right side in FIG. 3) formed on the third test pad 110-3 including the uneven portion 110-3G may have a shape according to (defined by) a shape of the top surface of the third test pad 110-3. In contrast, a bottom surface of the third bonding pad 130-3 (located on a left side in FIG. 3) formed on the third test pad 110-3 that does not have the uneven portion 110-3G may be a flat surface (e.g., a planar surface). As a result, some bonding pads 130B of a plurality of bonding pads 130B may have a greater thickness than other bonding pads 130B of the plurality of bonding pads 130B.

The die-to-wafer bonding structure 20 according to the technical idea of the inventive concept may form a structure that is not affected by surface uniformity of the third test pad 110-3 and is reliable, by having the uneven portion 110-3G of the third test pad 110-3 filled with the third bonding pad 130-3.

Referring to FIG. 4, a die-to-wafer bonding structure 30 may have a structure in which the die 100-1 is bonded to the wafer 100-2.

The die 100-1 may be formed in a structure in which a first barrier metal layer 131-1 surrounds the bottom surface and the side surface of the first bonding pad 130-1. The first barrier metal layer 131-1 may face the structure of the first test pad 110-1 such that a bottom surface of the first barrier metal layer 131-1 contacts the first test pad 110-1 and a side surface of the first barrier metal layer 131-1 contacts the first polymer layer 140-1.

In a substantially identical manner, the wafer 100-2 may be formed in a structure in which the second barrier metal layer 131-2 surrounds the lower surface and the side surface of the second bonding pad 130-2. The second barrier metal layer 131-2 may face the structure of the second bonding pad 130-2 such that a bottom surface of the second barrier metal layer 131-2 contacts the second test pad 110-2 and a side surface of the second barrier metal layer 131-2 contacts the second polymer layer 140-2.

The first barrier metal layer 131-1 may prevent diffusion of Cu, which may be a material constituting the first bonding pad 130-1, and may include a stacked structure including one or more of, for example, titanium (Ti) and tantalum (Ta), Titanium nitride (TiN), and tantalum nitride (TaN). However, the material of the first polymer layer 140-1 is not limited thereto.

The first bonding pad 130-1 and the first barrier metal layer 131-1 may be formed on some portions of the plurality of first test pads 110-1, and the first bonding pad 130-1 and the first barrier metal layer 131-1 may not be formed on other portions of the plurality of first test pads 110-1. For example, the first bonding pad 130-1 and the first barrier metal layer 131-1 may be formed only on some of the first test pads 110-1 (a sub-group) and may not be formed on the remaining first test pads 110-1 (remaining sub-group).

The first polymer layer 140-1 may be formed on the first test pad 110-1 and the first insulating layer 120-1 and may have a structure that surrounds side surfaces of the first barrier metal layer 130-1. The first polymer layer 140-1 may have a structure surrounding all of the side surfaces and the top surface of the first insulating layer 120-1 and the side surfaces of the first barrier metal layer 131-1. In addition, the top surface S1 of the first bonding pad 130-1, a top surface S11 of the first barrier metal layer 131-1, and the top surface S2 of the first polymer layer 140-1 may be coplanar with each other. This may result from the fact that the first bonding pad 130-1, the first barrier metal layer 131-1, and the first polymer layer 140-1 are planarized with each other, for example.

Although the first bonding pad 130-1 and the second bonding pad 130-2, the first barrier metal layer 131-1 and the second barrier metal layer 131-2, and the first polymer layer 140-1 and the second polymer layer 140-2 are distinguished from each other by a dashed-dotted line in FIG. 4, this illustration is intended to show that the first bonding pad 130-1, the first barrier metal layer 131-1, and the first polymer layer 140-1 originate from the die 100-1, and the second bonding pad 130-2, the second barrier metal layer 131-2, and the second polymer layer 140-2 originate from the wafer 100-2. Accordingly, the first bonding pad 130-1 and the second bonding pad 130-2 may be directly bonded to each other to form an integrated bonding pad 130C, the first barrier metal layer 131-1 and the second barrier metal layer 131-2 may be directly bonded to each other to form an integrated barrier metal layer 131C, and the first polymer layer 140-1 and the second polymer layer 140-2 may be directly bonded to each other to form an integrated polymer layer 140C.

Referring to FIG. 5, a die-to-wafer bonding structure 40 may have a structure in which the die 100-3 is bonded to the wafer 100-4.

The die-to-wafer bonding structure 40 may be conceptually considered substantially the same as combining the characteristics of the die-to-wafer bonding structure 20 (refer to FIG. 3) and the characteristics of the die-to-wafer bonding structure 30 (refer to FIG. 4).

Accordingly, those of ordinary skill in the art will understand the die-to-wafer bonding structure 40 by referring to the descriptions given above of the die-to-wafer bonding structures 20 and 30. Thus, a detailed description of the die-to-wafer bonding structure 40 is omitted.

Additionally, the third barrier metal layer 131-3 may fill the uneven portion 110-3G of the third test pad 110-3. Accordingly, a surface profile of a bottom surface of the third barrier metal layer 131-3 (located on the right side in FIG. 5) formed on the third test pad 110-3 including the uneven portion 110-3G may have a shape according to (defined by) a shape of the top surface of the third test pad 110-3 (also located on the right side in FIG. 5). In contrast, a bottom surface of the third barrier metal layer 131-3 (located on the left side in FIG. 5) formed on the third test pad 110-3 that does not have the uneven portion 110-3G (also located on the left side in FIG. 5) may be a flat surface.

Figure 6:
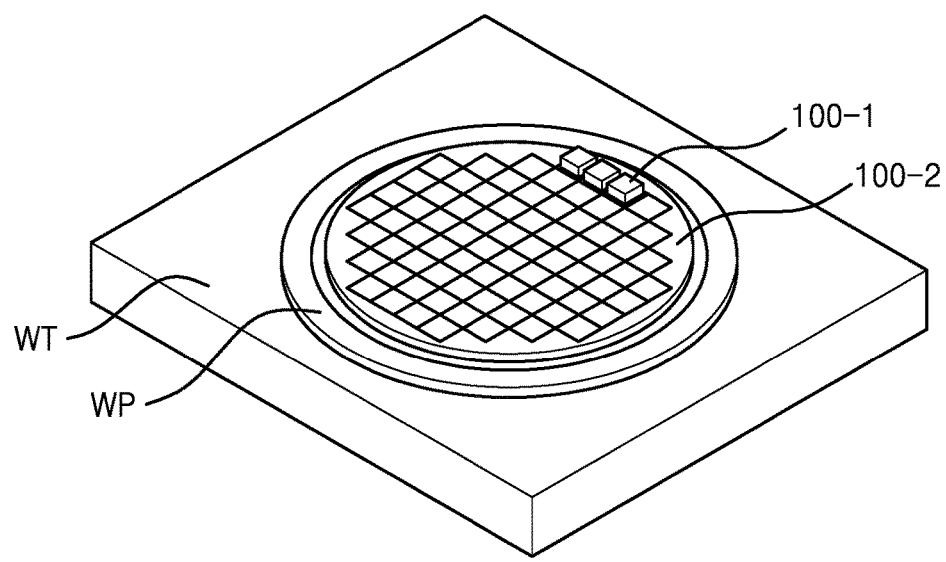
FIG. 6 is a perspective view illustrating a bonding process of a die-to-wafer, according to an embodiment of the inventive concept.

FIG. 6 is a perspective view illustrating a bonding process of a die-to-wafer, according to an embodiment of the inventive concept.

Referring to FIG. 6, the bonding process of the die-to-wafer may mount a plurality of dies 100-1 on one wafer 100-2.

First, one wafer 100-2 is loaded into a wafer fixation portion WP of a wafer table WT. Next, the plurality of dies 100-1 may be sequentially mounted on the one wafer 100-2. Finally, the one wafer 100-2 may be unloaded to the wafer table WT, and a mounting process of the plurality of dies 100-1 may be completed. The operations described above may be performed by changing the order as needed.

In FIG. 6, a state is illustrated in which three dies 100-1 are mounted on one wafer 100-2, but this is only an example of bonding processes, and a larger number of dies 100-1 may be sequentially mounted on the wafer 100-2.

In the bonding process, a die-to-wafer bonding structure according to the technical concept of the inventive concept may increase productivity and reliability of a semiconductor package, because tested and screened dies 100-1 (known good dies KGD) are mounted on one wafer 100-2 in a reliable bonding structure.

In some embodiments, at least one of the plurality of dies 100-1 mounted on one wafer 100-2 may be a dummy die. In other words, the plurality of dies 100-1 that have been screened and at least one dummy die may be mounted together on one wafer 100-2. In other embodiments, without the dummy die, only the plurality of dies 100-1 that have been screened may be mounted on one wafer 100-2.

Figure 7:
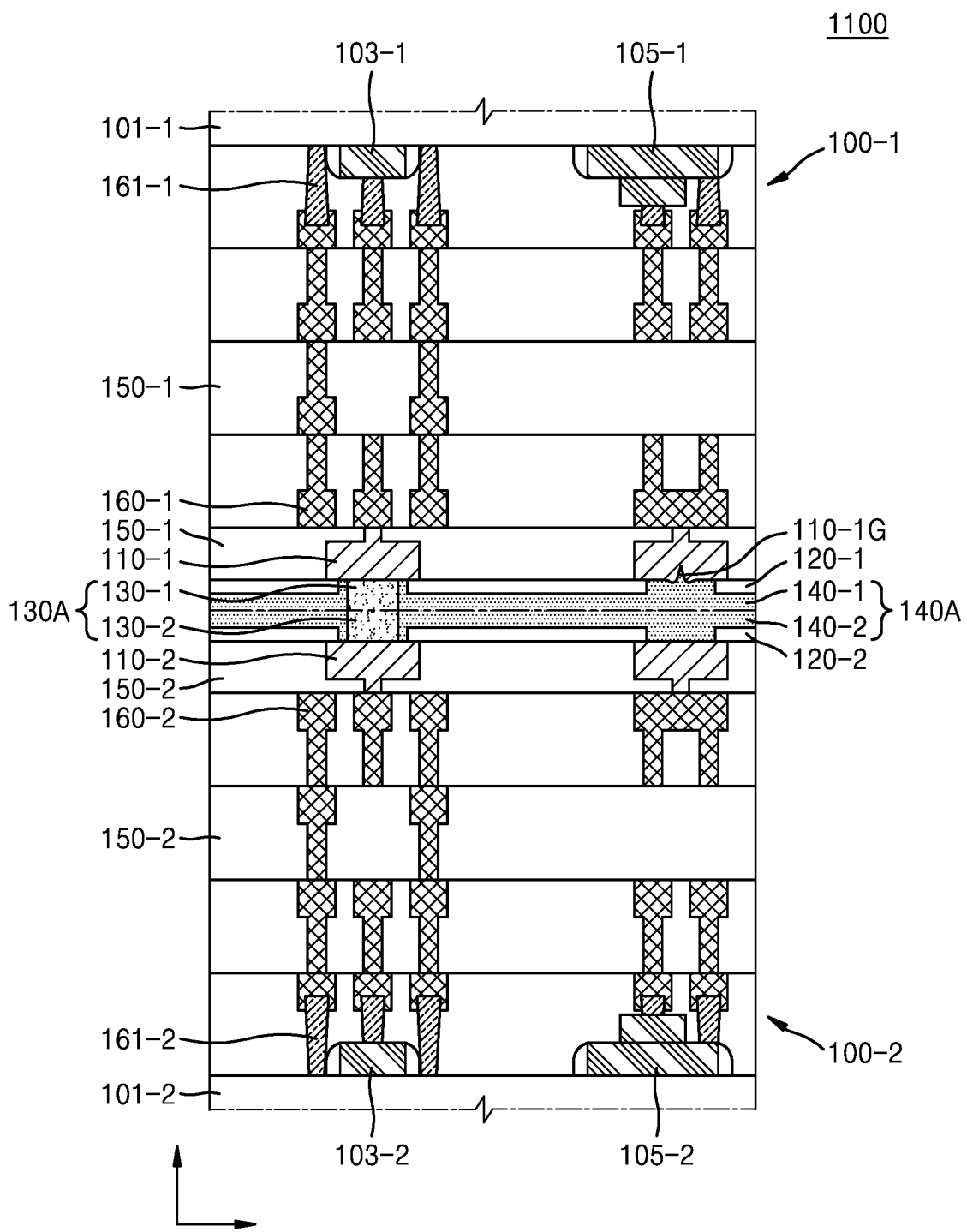
FIG. 7 is a cross-sectional view illustrating a die-to-wafer bonding structure according to an embodiment of the inventive concept.

FIG. 7 is a cross-sectional view illustrating a die-to-wafer bonding structure 1100 according to an embodiment of the inventive concept.

Referring to FIG. 7, the die-to-wafer bonding structure 1100 may illustrate in detail the first and second interlayer insulating layers 150-1 and 150-2, a first metal wiring layer 160-1 and a second metal wiring layer 160-2, a first integrated circuit layer 103-1 and a second integrated circuit layer 103-2, and a first integrated circuit layer 105-1 and a second integrated circuit layer 105-2.

Hereinafter, the die 100-1 arranged in a top portion of the die-to-wafer bonding structure 1100 is described.

The die 100-1 may include a first substrate 101-1, the first integrated circuit layers 103-1 and 105-1, the first test pad 110-1, the first insulating layer 120-1, the first bonding pad 130-1, the first polymer layer 140-1, the first interlayer insulating layer 150-1, and the first metal wiring layer 160-1.

The first substrate 101-1 may include Si. In some embodiments, the first substrate 101-1 may include semiconductor elements such as germanium (Ge), or a compound semiconductor elements such as silicon carbide (SiC), gallium arsenide (GaAs), indium arsenide (InAs), and indium phosphide (InP). In some embodiments, the first substrate 101-1 may have a silicon on insulator (SOI) structure. For example, the first substrate 101-1 may include a buried oxide (BOX) layer. In addition, the first substrate 101-1 may include a conductive region, for example, a well doped with an impurity, or a structure doped with an impurity. In addition, the first substrate 101-1 may have various device isolation structures such as a shallow trench isolation (STI) structure.

The first integrated circuit layers 103-1 and 105-1 may be formed on the first substrate 101-1 and may include, for example, various semiconductor devices such as transistors, diodes, resistors, and capacitors. FIG. 7 illustrates a transistor as a representative integrated circuit. The transistor may include, for example, source/drain regions and a channel region formed in the first substrate 101-1, and a gate structure formed on the first substrate 101-1.

In some embodiments, the transistor included in the first integrated circuit layer 103-1 (located on the left side in FIG. 7) may be a transistor used in a memory device, and the transistor included in the first integrated circuit layer 105-1 (located on the right side in FIG. 7) may be a transistor used in a logic device or a ferry region, for example.

The first integrated circuit layers (103-1 and 105-1) may be electrically connected to the first metal wiring layer 160-1 through a first contact 161-1 and may exchange electrical signals with the outside through the first metal wiring layer 160-1. Here, the electrical signals may include a power supply voltage, a ground voltage, a signal voltage, and the like, for example. The first metal wiring layer 160-1 may include a plurality of wiring layers. The first metal wiring layer 160-1 may include Cu, but example embodiments are not limited thereto.

The first interlayer insulating layer 150-1 may be formed on the first substrate 101-1 and cover the first integrated circuit layers (103-1 and 105-1) and the first metal wiring layer 160-1. The first interlayer insulating layer 150-1 may include multiple layers corresponding to the number of wiring layers constituting the first metal wiring layer 160-1. When the first interlayer insulating layer 150-1 includes multiple layers, the first interlayer insulating layer 150-1 may include a plurality of the same single material layers, or may include at least two layers having different material layers.

The first test pad 110-1 may be configured in plural, e.g., a plurality of first test pads 110-1. The first bonding pads 130-1 may be formed on a portion (sub-group) of the plurality of first test pads 110-1, and the first bonding pads 130-1 may not be formed on other remaining portions (remaining sub-group) of the plurality of first test pads 110-1. The first insulating layer 120-1, the first bonding pad 130-1, and the first polymer layer 140-1 may be in contact with the top surface of the first test pad 110-1 on which the first bonding pad 130-1 is formed. In addition, the first insulating layer 120-1 and the first polymer layer 140-1 may be in contact with the top surface of the first test pad 110-1 on which the first bonding pad 130-1 is not formed.

Details of the first insulating layer 120-1, the first bonding pad 130-1, and the first polymer layer 140-1 may be substantially the same or similar as those described with reference to FIG. 1, and thus, detailed descriptions thereof are omitted here.

The distinction between the first bonding pad 130-1 and the second bonding pad 130-2, and the first polymer layer 140-1 and the second polymer layer 140-2 may be merely for convenience of description and for understanding of its respective origin. Accordingly, the first bonding pads 130-1 and the second bonding pads 130-2 may be inseparably bonded (directly bonded) to each other as an integrated bonding pad 130A, and the first polymer layer 140-1 and the second polymer layer 140-2 may be indivisibly bonded (directly bonded) to each other as an integrated polymer layer 140A.

In addition, although the wafer 100-2 and the die 100-1 are illustrated to have the same size, the wafer 100-2 may have a size on which a plurality of dies 100-1 are mounted. In other words, the wafer 100-2 may include a substrate before cutting, and the die 100-1 may represent a substrate after cutting.

As described above with reference to FIG. 6, the die-to-wafer bonding structure 1100 according to the technical concept of the inventive concept may increase productivity and reliability of a semiconductor package, because tested and screened dies 100-1 (known good die KGD) are mounted on one wafer 100-2 in a reliable bonding structure.

FIGS. 8A through 8I are cross-sectional views illustrating processes of manufacturing the die-to-wafer bonding structure 1100 of FIG. 7.

Figure 8A:
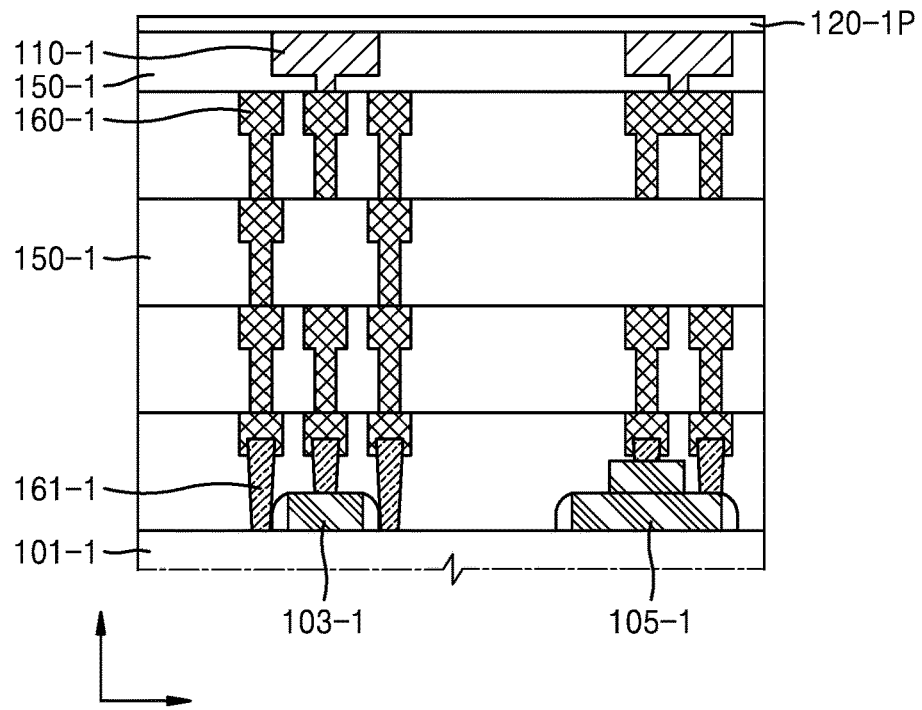
FIGS. 8A through 8I are cross-sectional views illustrating processes of manufacturing the die-to-wafer bonding structure of FIG. 7.

Referring to FIG. 8A, it is illustrated that the first integrated circuit layers (103-1 and 105-1), the first interlayer insulating layer 150-1, and the first metal wiring layer 160-1 are formed on the first substrate 101-1. Additionally, the first test pad 110-1 electrically connected to the first metal wiring layer 160-1 is formed, and a preliminary insulating layer 120-1P is formed on the first test pad 110-1 and the first interlayer insulating layer 150-1.

The preliminary insulating layer 120-1P may be formed to cover both the top surface of the first test pad 110-1 and the top surface of the first interlayer insulating layer 150-1 at the uppermost layer thereof. The preliminary insulating layer 120-1P may include silicon oxide, silicon nitride, and/or silicon oxynitride, for example. The preliminary insulating layer 120-1P may be formed as a single layer as illustrated, or may be formed as multiple layers, for example.

Figure 8B:
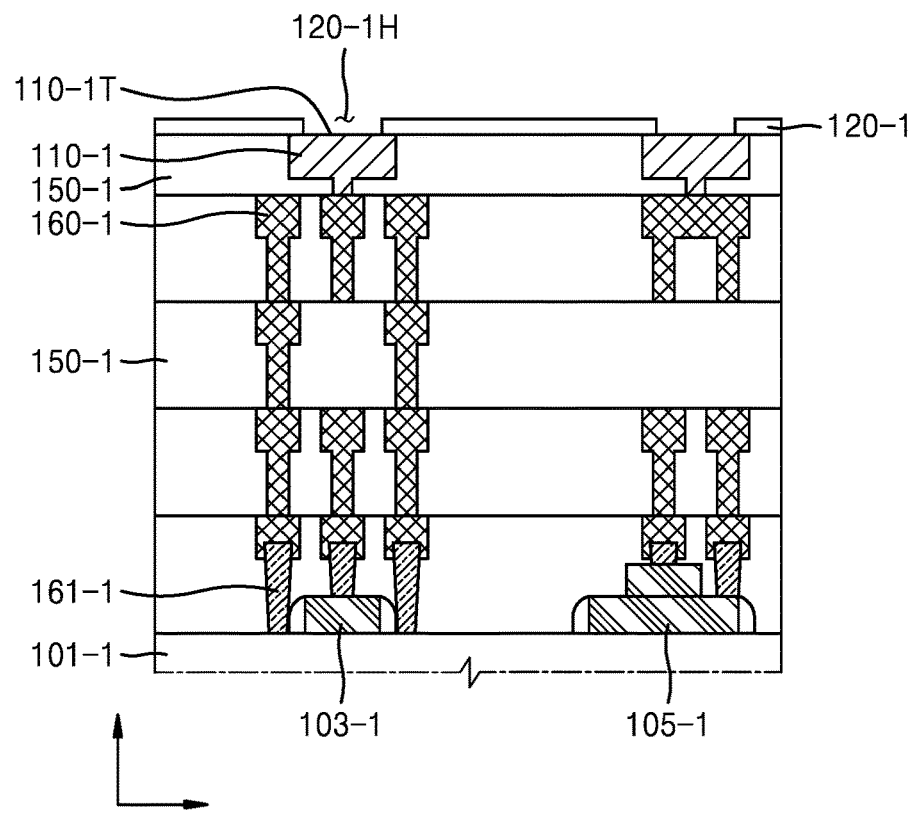

Referring to FIG. 8B, it is illustrated that the first opening 120-1H exposes the top surface of the first insulating layer 120-1 and the first opening 120-1H exposes a top surface 110-1T of the first test pad 110-1 is formed, by patterning the preliminary insulating layer 120-1P (refer to FIG. 8A) by a photo process and an etching process.

A photomask pattern (not illustrated) may be formed on the preliminary insulating layer 120-1P (refer to FIG. 8A), and the preliminary insulating layer 120-1P including the first opening 120-1H may be formed, by using the photomask pattern as an etch mask, and etching the first insulating layer 120-1P (refer to FIG. 8A). After the first insulating layer 120-1 is formed, the photomask pattern may be removed by an ashing process and stripping process, for example.

The first insulating layer 120-1 may cover a portion of a top surface 110-1T of the first test pad 110-1. In other words, the first insulating layer 120-1 may not completely expose the top surface 110-1T of the first test pad 110-1, but may still cover an edge portion. For example, the first insulating layer 120-1 may partly expose a central portion of the top surface 110-1T of the first test pad 110-1 and cover the remaining edge portion(s) of the top surface 110-1T of the first test pad 110-1.

Figure 8C:
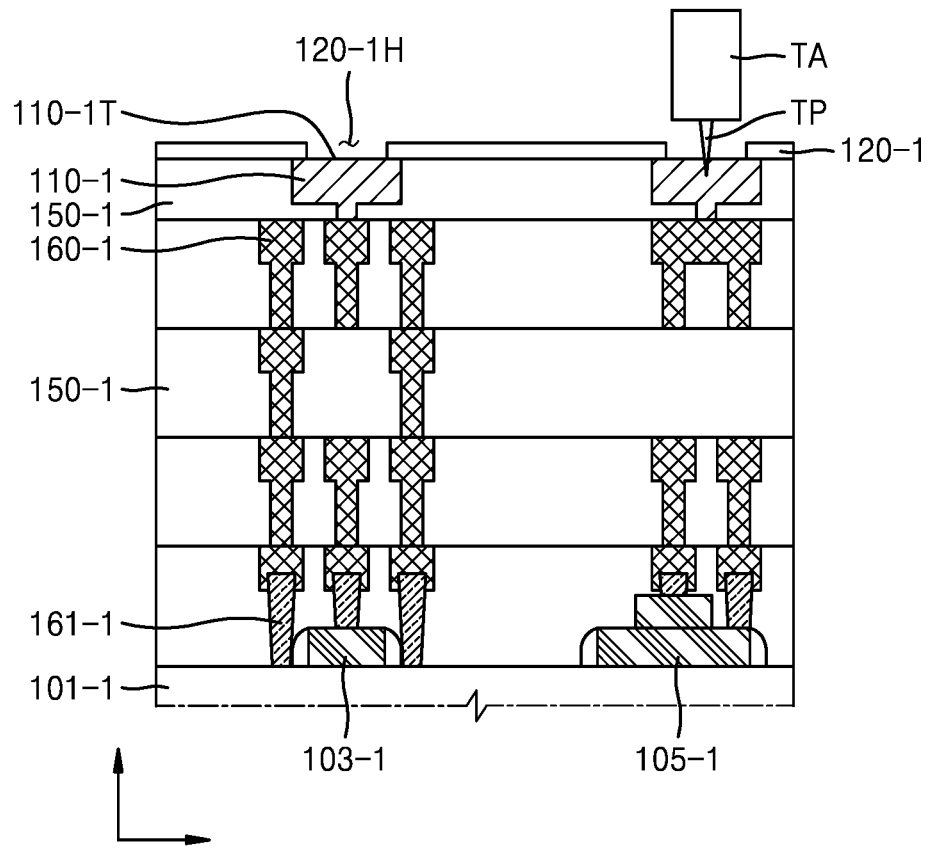

Referring to FIG. 8C, a test process may be performed on the die 100-1 (refer to FIG. 8A) by using the test apparatus TA.

The test process may be performed to verify functionality and electrical connection characteristics of the die 100-1 (refer to FIG. 8A).

The test apparatus TA may include the needle-shaped test pin TP, and the test pin TP may make physical contact with the first test pad 110-1 in order to perform the test process.

A contact test process, such as illustrated in FIG. 8C for example, may have a relatively high test performance compared with a non-contact test process.

The test pin TP may be, for example, a portion of a probe card connected to the test apparatus TA. In addition, a plurality of test pins TP may be on the probe card.

Figure 8D:
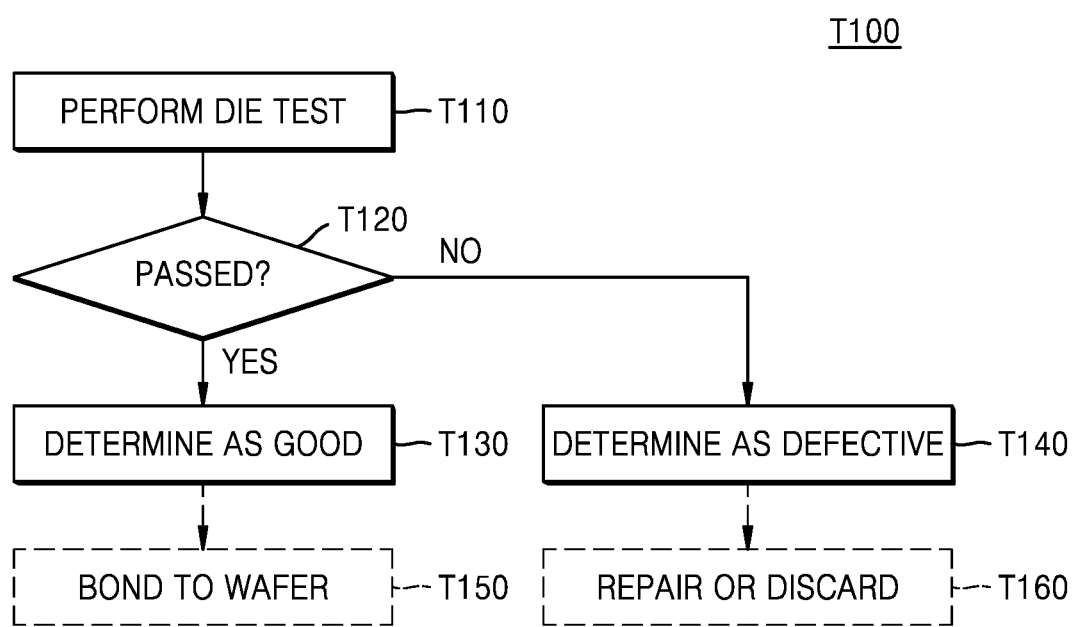

Referring to FIG. 8D, the test process T100 using the test apparatus TA (refer to FIG. 8C) may include first through sixth operations T110 through T160.

Those with skill in the art will readily understand that when a certain embodiment is implemented differently, a certain operation may be performed differently from a described order. For example, two consecutively described operations may be substantially performed at the same time or in an order differing from or opposite to the described order.

The first operation T110 of testing a die may be performed. Tests on the die may include, for example, a DC test, an AC test, and/or a functional test. Such tests may be a contact test process as described above. However, the test types and methods described above are not limited thereto.

The second operation T120 may be performed to verify whether a test result has passed. After passing the test, a die may be moved to the third operation T130 that screens the die. On the other hand, if the die does not pass the test it may be moved to the fourth operation T140 that determines the die as defective.

If the die is determined as good at the third operation T130, the fifth operation T150 may be performed in which the die determined as good is bonded to a wafer in a subsequent process. On the other hand, if the die is determined as defective at the fourth operation T140, the sixth operation T160 in which the die determined as defective is repaired or discarded in a subsequent process may be performed.

As a result, the die selected as having "passed" and/or is considered good through the test process T100 may be mounted on a wafer in a reliable direct bonding structure.

Figure 8E:
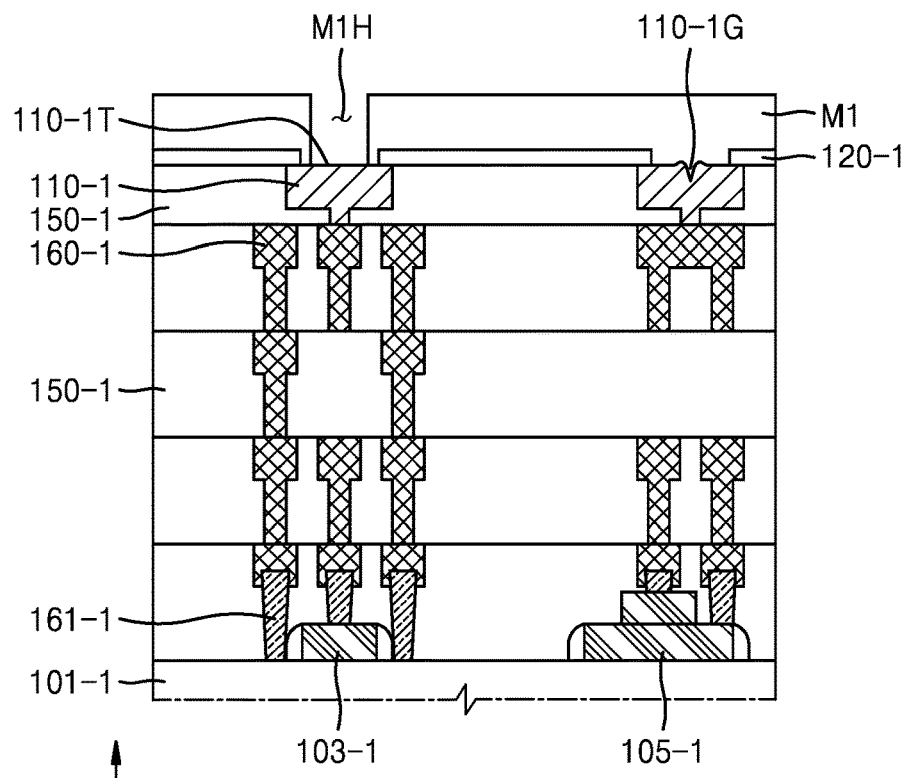

Referring to FIG. 8E, a shape is illustrated in which a mask pattern M1 covering portions of the first insulating layer 120-1 and the top surface 110-1T of the first test pad 110-1 is formed.

The mask pattern M1 may be formed as a pattern having a second opening M1H exposing a portion of the top surface 110-1T of the first test pad 110-1. The mask pattern M1 may be a photomask pattern or a hard mask pattern, for example.

Although only one second opening M1H is illustrated in FIG. 8E, a plurality of second openings M1H may be formed. In other words, since a portion of the top surface 110-1T of the first test pad 110-1 exposed by the second opening M1H of the mask pattern M1 corresponds to a portion in which the preliminary bonding pads 130-1P (refer to FIG. 8F) are formed in a subsequent process, when the preliminary bonding pad 130-1P (refer to FIG. 8F) is formed in plural number, the second opening M1H of the mask pattern M1 may be formed in plural number to correspond to each of the preliminary bonding pads 130-1P (refer to FIG. 8F). For example, in embodiments with plural first test pads 110-1 there may be a corresponding second opening M1H for each corresponding first test pad 110-1 of the plurality of first test pads 110-1.

Figure 8F:
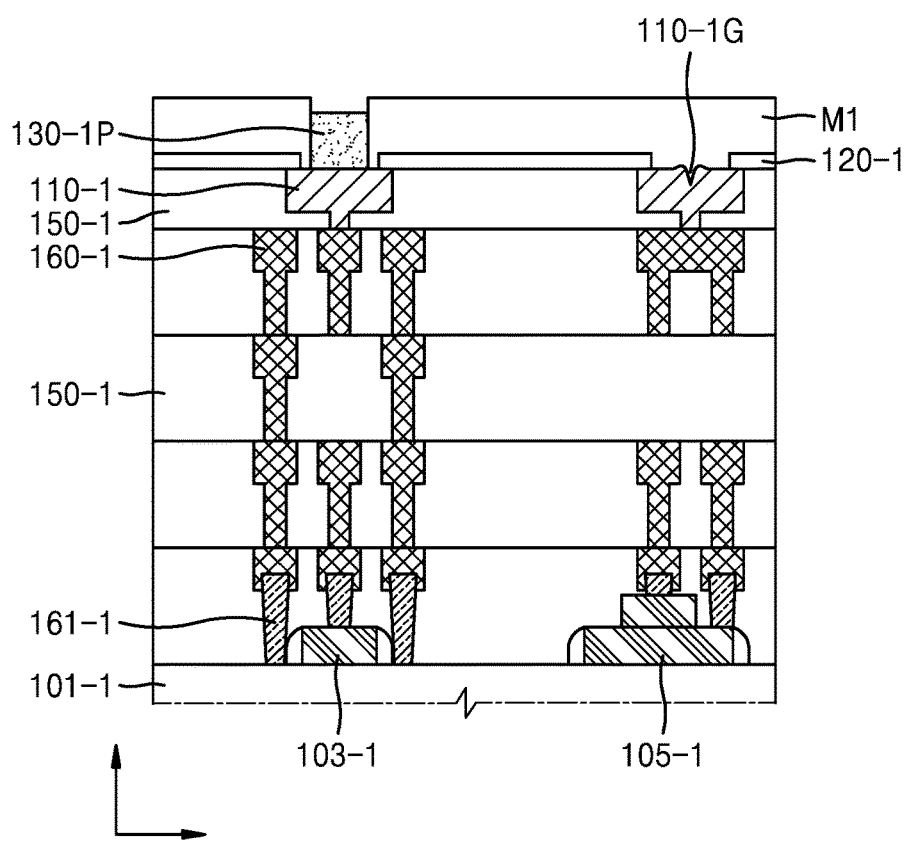

Referring to FIG. 8F, the preliminary bonding pads 130-1P may be formed to fill the second opening M1H (refer to FIG. 8E) of the mask pattern M1. For example, a preliminary bonding pad 130-1P may fill, at least partially, the second opening M1H.

To form the preliminary bonding pad 130-1P, a plating process may be performed on the first substrate 101-1 on which the mask pattern M1 is formed, for example. In some embodiments, a seed layer (not illustrated) may be first formed on the first test pad 110-1, and then, a preliminary bonding pad 130-1P may be formed by using the seed layer through a plating process, for example.

The preliminary bonding pads 130-1P may include, for example, a metal formed of copper (Cu), nickel (Ni), and gold (Au) or an alloy thereof, or a multilayer structure of a plurality of metals of Cu and Ni, and Au. Here, the preliminary bonding pads 130-1P is described as including Cu.

The preliminary bonding pads 130-1P may be formed to fill only a portion of the mask pattern M1 without completely filling the second opening M1H (refer to FIG. 8E) of the mask pattern Ml. In other words, a level of the top surface of the preliminary bonding pads 130-1P may be lower than a level of the top surface of the mask pattern Ml. For example, when viewed in a cross section view, an elevation of the top surface of the preliminary bonding pads 130-1P may be lower than an elevation of the top surface of the mask pattern M1.

Figure 8G:
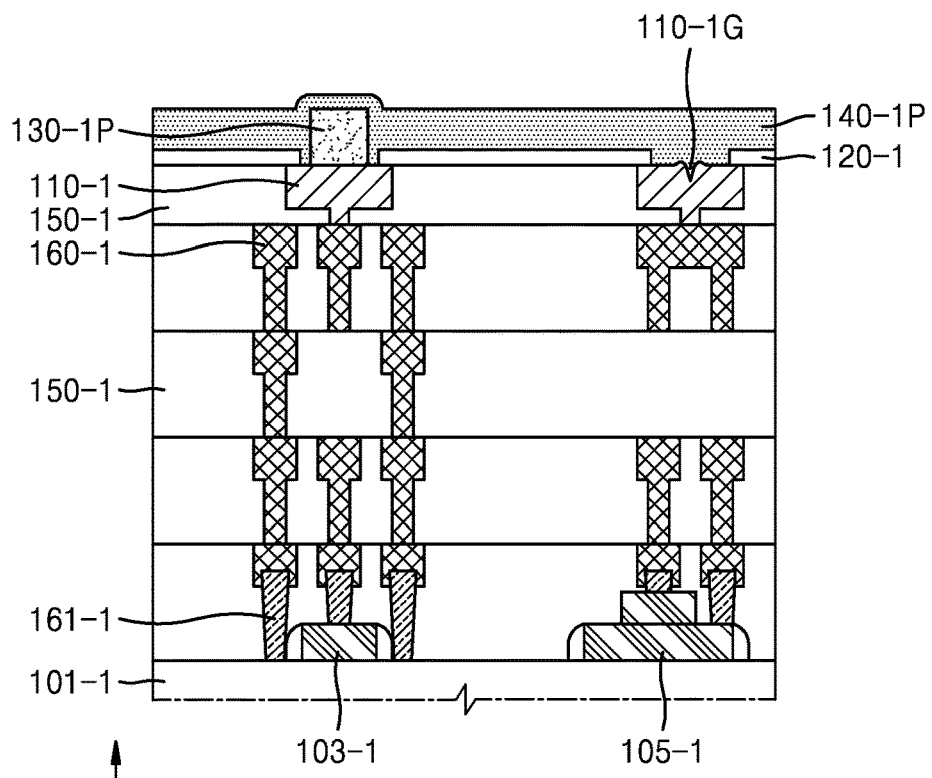

Referring to FIG. 8G, the mask pattern M1 (refer to FIG. 8F) may be removed, and the preliminary polymer layer 140-1P may be formed to completely cover the first test pad 110-1, the first insulating layer 120-1, and the preliminary bonding pad 130-1P.

The preliminary polymer layer 140-1P may fill a gap between a sidewall of the first insulating layer 120-1 and a sidewall of the preliminary bonding pad 130-1P. In addition, the preliminary polymer layer 140-1P may fill an uneven portion 110-1G formed in at least one of the first test pads 110-1.

The preliminary polymer layer 140-1P may be initially formed to a greater thickness than a final design thickness thereof because some of the preliminary polymer layer 140-1P may be removed by a subsequent process. For example, compare preliminary polymer layer 140-1P of FIG. 8G with first polymer layer 140-1 of FIG. 8H. In addition, a material constituting the preliminary polymer layer 140-1P may be appropriately adjusted considering a ratio or amount at which the preliminary polymer layer 140-1P is removed by a subsequent process.

Figure 8H:
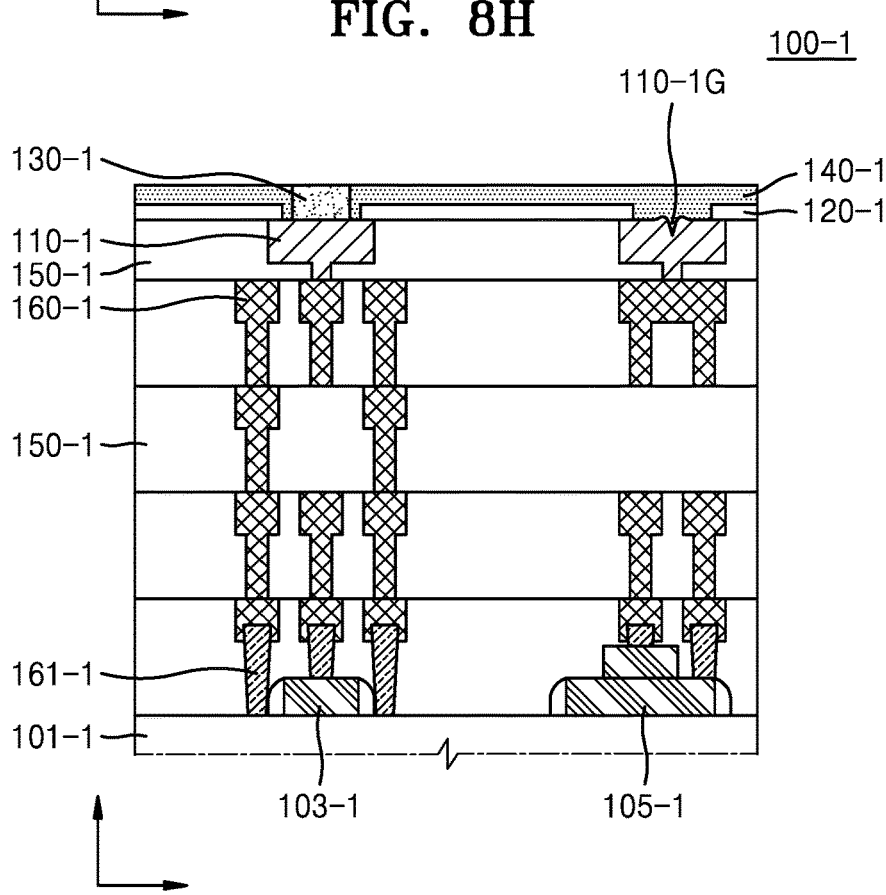

Referring to FIG. 8H, a resultant product that includes the preliminary polymer layer 140-1P (refer to FIG. 8G) so that the top surface of the first bonding pad 130-1 is exposed may be polished by using a chemical mechanical polishing (CMP) process, for example.

By the CMP process, the first bonding pad 130-1 and the first polymer layer 140-1 may be formed. The thickness of the first bonding pad 130-1 may be less than the thickness of the preliminary bonding pad 130-1P (refer to FIG. 8G). In addition, the thickness of the first polymer layer 140-1 may be less than the thickness of the preliminary polymer layer 140-1P (refer to FIG. 8G).

The top surface of the first bonding pad 130-1 and the top surface of the first polymer layer 140-1 may be formed on the same plane to be co-planar. This characteristic may be a result of the planarization characteristics of the CMP process.

Figure 8I:
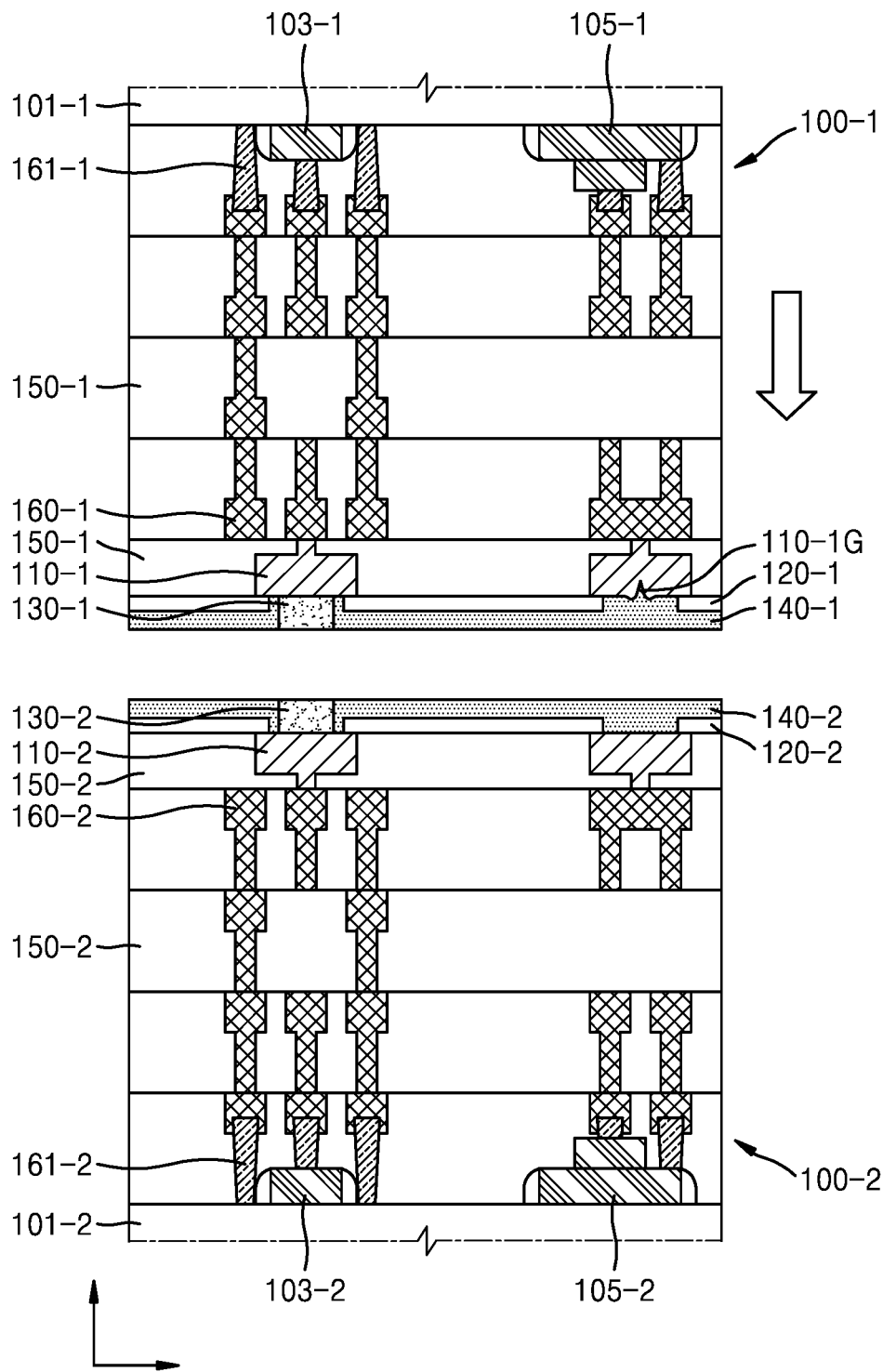

Referring to FIG. 8I, the wafer 100-2 (of FIG. 8I) may have a structure similar to that of the die 100-1 (of FIG. 8I).

The die 100-1 may be placed on the wafer 100-2 such that the first bonding pad 130-1 faces the second bonding pad 130-2, and in addition, the position of the die 100-1 may also be precisely aligned. For example, the top surface of the first bonding pad 130-1 may be aligned to exactly match the top surface of the second bonding pad 130-2.

Referring back to FIG. 7, the first bonding pad 130-1 and the second bonding pad 130-2 may be bonded to each other to form the bonding pad 130A, and the die 100-1 and the wafer 100-2 may be bonded by bonding the first polymer layer 140-1 to the second polymer layer 140-2 to form the polymer layer 140A.

By the bonding of the die 100-1 and the wafer 100-2, the die-to-wafer bonding structure 1100 according to the technical idea of the inventive concept may be implemented.

In addition, a manufacturing process of the die-to-wafer bonding structure 1100 may be substantially the same as or similar to the manufacturing process of the semiconductor package. Accordingly, one of ordinary skill in the art may understand the manufacturing process of the semiconductor package from the manufacturing process of the die-to-wafer bonding structure 1100 described above.

Figure 9:
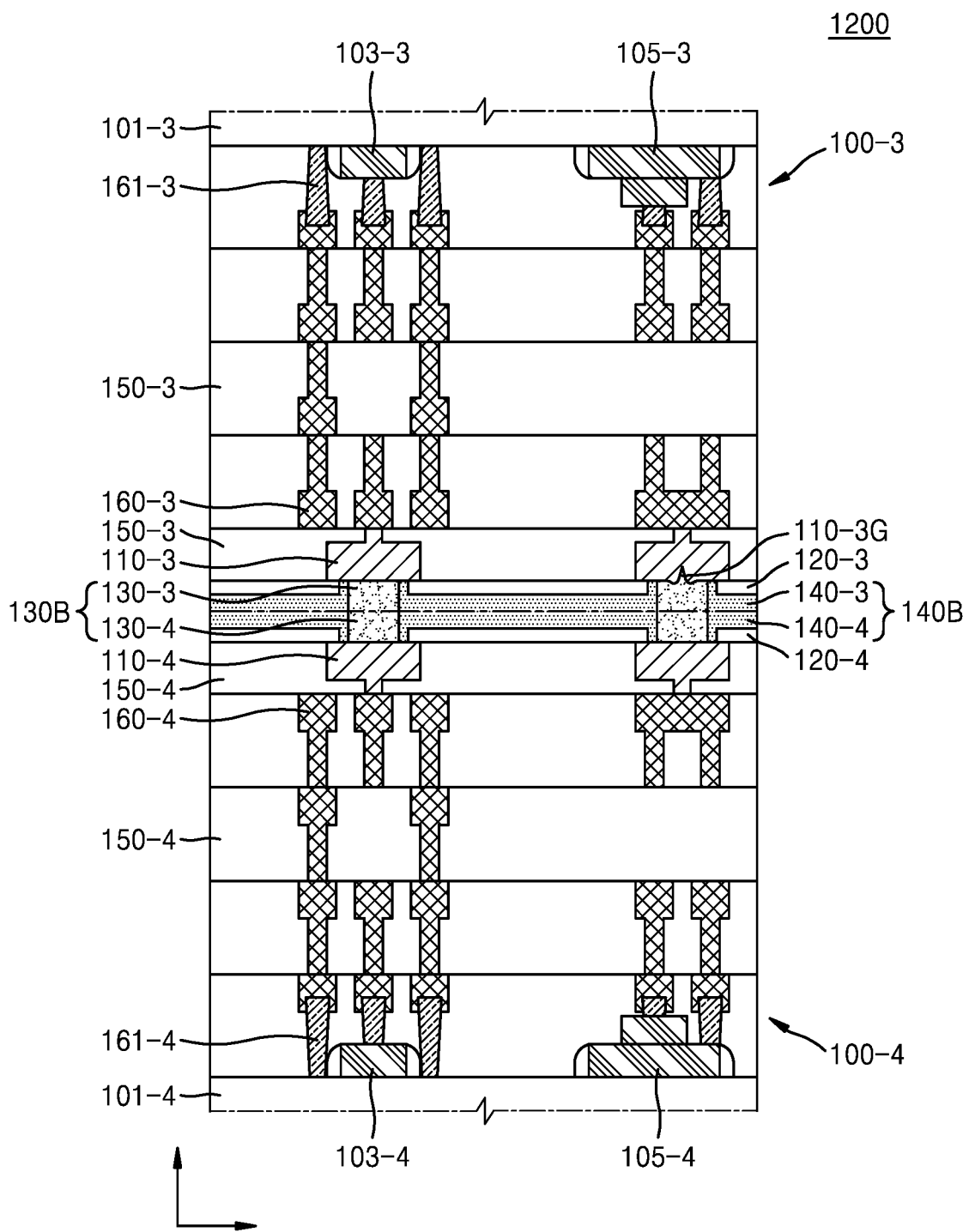
FIG. 9 is a cross-sectional view illustrating a die-to-wafer bonding structure according to an embodiment of the inventive concept.

FIG. 9 is a cross-sectional view illustrating a die-to-wafer bonding structure 1200 according to an embodiment of the inventive concept.

Most of the components constituting the die-to-wafer bonding structure 1200 and the materials included in the components to be described below may be substantially the same as or similar to those described above with reference to FIG. 7. Accordingly, for convenience of description, descriptions focused on differences from the die-to-wafer bonding structure 1100 (refer to FIG. 7) described above are given below.

Referring to FIG. 9, the die-to-wafer bonding structure 1200 may illustrate in detail the third and fourth interlayer insulating layers 150-3 and 150-4, a third metal wiring layer 160-3 and a fourth metal wiring layer 160-4, and third integrated circuit layers (103-3 and 105-3) and fourth integrated circuit layers (103-4 and 105-4).

The third bonding pad 130-3 may be formed on each test pad of a plurality of third test pads 110-3. The third bonding pad 130-3 may be arranged such that a bottom surface of the third bonding pad 130-3 contacts the top surface of the third test pad 110-3. All of the side surfaces of the third bonding pad 130-3 may be surrounded by the third polymer layer 140-3.

The third test pad 110-3 may include some other characteristics in comparison with the fourth test pad 110-4. For example, an uneven portion 110-3G may be formed in at least one of the third test pads 110-3. The uneven portion 110-3G of the third test pad 110-3 may be formed in a contact test process (see T100 of FIG. 8D) for screening the die 100-3. In some embodiments, an uneven portion may not be formed in the fourth test pad 110-4. Additionally, some embodiments may include third test pads 110-3 having an uneven portion 110-3G and third test pads 110-3 that do not have an uneven portion 110-3G.

The third bonding pad 130-3 may fill the uneven portion 110-3G of the third test pad 110-3. Accordingly, a surface profile of a bottom surface of the third bonding pad 130-3 (located on the right side in FIG. 3) formed on the third test pad 110-3 including the uneven portion 110-3G may have a shape according to a shape of the top surface of the third test pad 110-3. For example, a surface profile of the bottom surface of the third bonding pad 130-3 may be defined by the shape of the top surface of the third test pad 110-3. In contrast, a bottom surface of the third bonding pad 130-3 (located on a left side in FIG. 3) formed on the third test pad 110-3 that does not have the uneven portion 110-3G may be a flat surface. As a result, some bonding pads of a plurality of bonding pads 130B may have a greater thickness in the vertical direction than other bonding pads 130B.

Figure 10A:
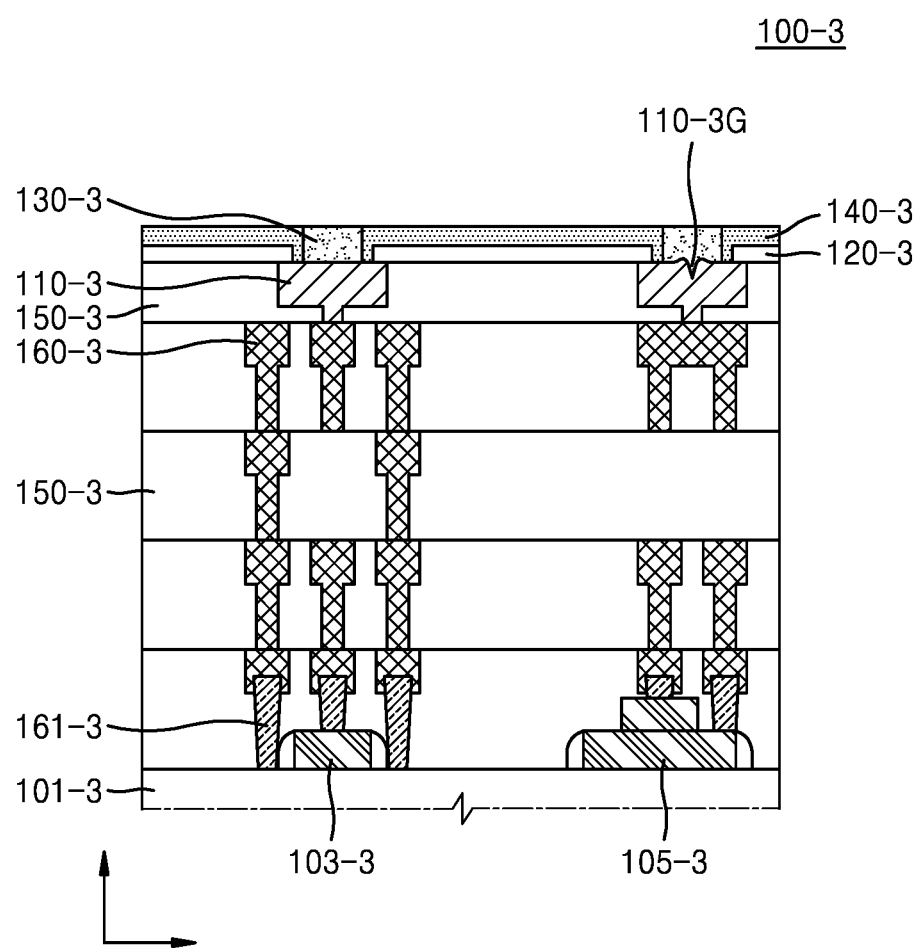
FIGS. 10A and 10B are cross-sectional views illustrating portions of a process of manufacturing the die-to-wafer bonding structure of FIG. 9.
Figure 10B:
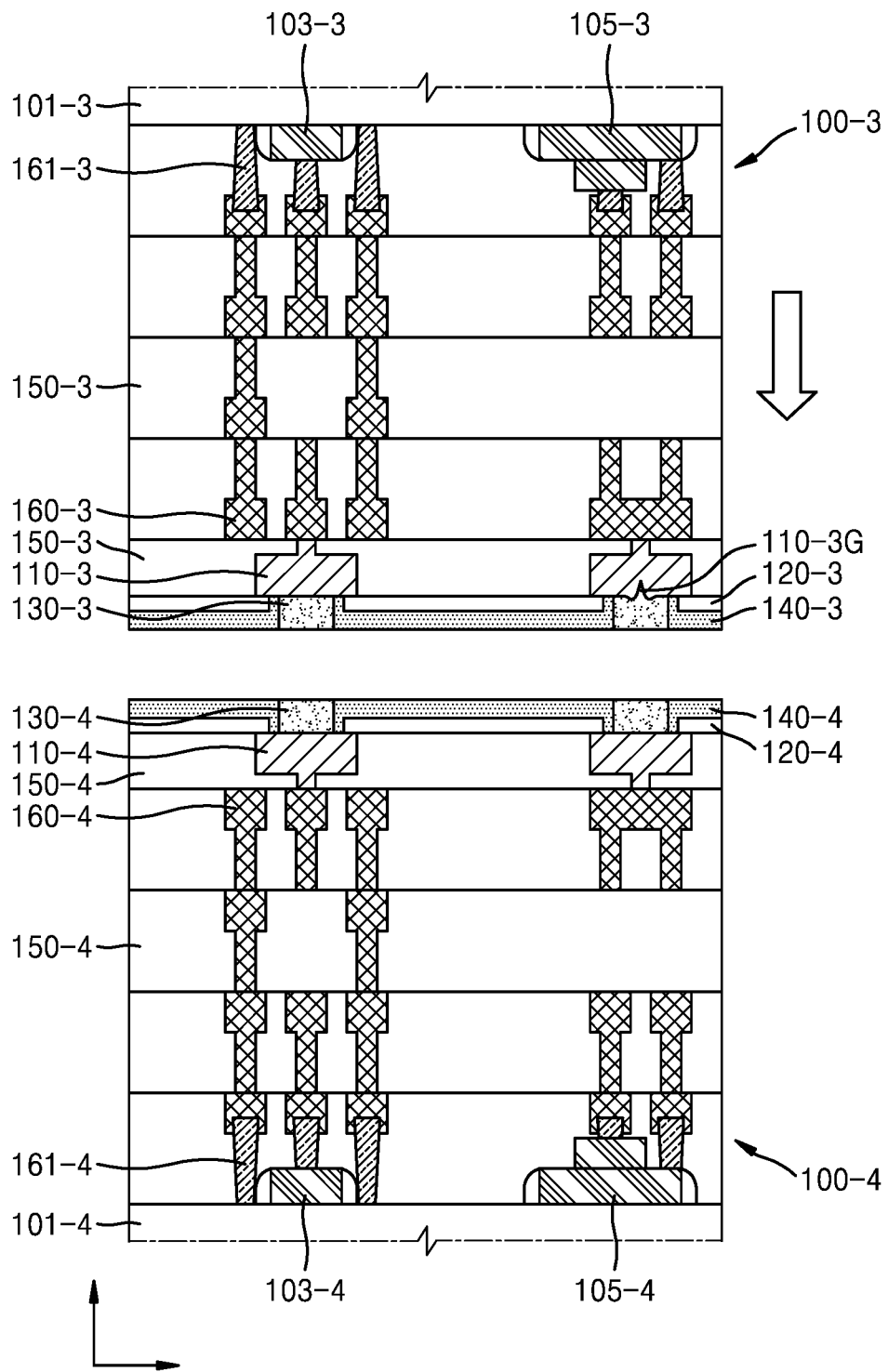

FIGS. 10A and 10B are cross-sectional views illustrating portions of a process of manufacturing the die-to-wafer bonding structure 1200 of FIG. 9.

Most of the manufacturing operations constituting the manufacturing method of the die-to-wafer bonding structure described below are substantially the same as or similar to those described above with reference to FIGS. 8A through 8I. Additionally, there is a difference in the process of forming the third bonding pad 130-3 also on the third test pad 110-3 including an uneven portion 110-3G. Accordingly, for convenience of description, descriptions focused on differences from the die-to-wafer bonding structures described above are given below.

Referring to FIG. 10A, the third bonding pad 130-3 may be formed on the third test pad 110-3.

The third bonding pad 130-3 may be formed on all of the test pads of a plurality of third test pads 110-3. The third bonding pad 130-3 may be arranged such that a bottom surface of the third bonding pad 130-3 contacts the top surface of the third test pad 110-3. All side surfaces of the third bonding pad 130-3 may be surrounded by the third polymer layer 140-3.

The third bonding pad 130-3 may be formed by polishing a preliminary bonding pad (not illustrated) by a CMP process, and the third polymer layer 140-3 may be formed by polishing a preliminary polymer layer (not illustrated) by a CMP process, for example.

The top surface of the third bonding pad 130-3 and the top surface of the third polymer layer 140-3 may be formed on the same plane and therefore be considered co-planar. This characteristic may be a result of the planarization characteristics of a CMP process.

FIG. 10B illustrates that the wafer 100-4 having a structure similar to that of the die 100-1 is prepared.

The die 100-3 may be placed on the wafer 100-4 such that the third bonding pad 130-3 faces the fourth bonding pad 130-4, and in addition, the position of the die 100-3 may also be precisely aligned. For example, the top surface of the third bonding pad 130-3 may be aligned to exactly match the top surface of the fourth bonding pad 130-4.

Referring back to FIG. 9, the third bonding pad 130-3 and the fourth bonding pad 130-4 may be bonded to each other to form the bonding pad 130B, and the die 100-3 and the wafer 100-4 may be bonded by bonding the third polymer layer 140-3 and the fourth polymer layer 140-4 to form the polymer layer 140B.

By the bonding of the die 100-3 and the wafer 100-4, the die-to-wafer bonding structure 1200 according to the technical idea of the inventive concept may be implemented.

Figure 11:
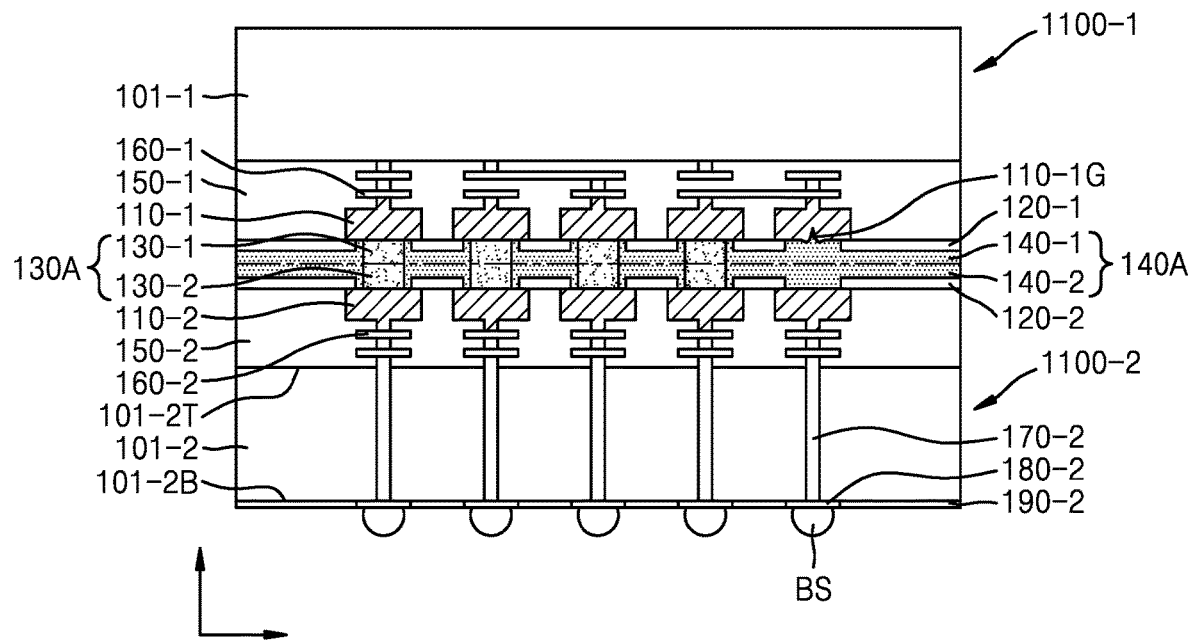
FIG. 11 is a cross-sectional view illustrating a semiconductor package according to an embodiment of the inventive concept.

FIG. 11 is a cross-sectional view illustrating a semiconductor package 1100P according to the technical idea of the inventive concept.

Referring to FIG. 11, the semiconductor package 1100P may form a direct bonding structure by using a semiconductor chip 1100-1, a second semiconductor chip 1100-2, the bonding pad 130A, and the polymer layer 140A.

The first semiconductor chip 1100-1 may be manufactured from the die 100-1 described above, and the second semiconductor chip 1100-2 may be manufactured from the wafer 100-2 described above. Accordingly, since most of the components constituting the first and second semiconductor chips 1100-1 and 1100-2 are the same as or similar to those as described above, only the differences thereof are described below.

The first and second semiconductor chips 1100-1 and 1100-2 included in the semiconductor package 1100P may be a logic chip or a memory chip, respectively. For example, the first and second semiconductor chips 1100-1 and 1100-2 may be memory chips of the same type, or one chip among the first and second semiconductor chips 1100-1 and 1100-2 may be a memory chip and the other chip may be a logic chip. For example, the first semiconductor chip(s) 1100-1 may be memory chip(s) and the second semiconductor chip(s) 1100-2 may be logic chip(s).

A memory chip may be, for example, a volatile memory semiconductor chip such as dynamic random access memory (RAM) (DRAM) and static RAM (SRAM), or a nonvolatile memory chip such as phase-change RAM (PRAM), magneto-resistive RAM (MRAM), ferroelectric RAM (FeRAM), and resistive RAM (RRAM). In addition, the logic chip may include, for example, a microprocessor, an analog element, or a digital signal processor.

The second semiconductor chip 1100-2 may include a through electrode 170-2 penetrating the second substrate 101-2. A bump pad 180-2 may be on a bottom surface 101-2B of the second substrate 101-2 such that the bottom surface 101-2B is connected to the through electrode 170-2. The bump pad 180-2 may include at least one of Al, Cu, Ni, tungsten (W), platinum (Pt), and Au, but is not limited thereto.

A passivation layer 190-2 may be formed on the bottom surface 101-2B of the second substrate 101-2. The passivation layer 190-2 may expose the bump pads 180-2.

The through electrode 170-2 may penetrate through the second substrate 101-2, extend from the top surface 101-2T of the second substrate 101-2 toward the bottom surface 101-2B, and may be connected to the second metal wiring layer 160-2. The through electrode 170-2 may have a columnar shape. The through electrode 170-2 may include a through silicon via (TSV), for example.

The bump structure BS may contact the bump pad 180-2. The semiconductor package 1100P may receive a control signal, a power signal, and a ground signal for the operations of the first and second semiconductor chips 1100-1 and 1100-2 by the bump structure BS, or receive a data signal to be stored in the first and second semiconductor chips 1100-1 and 1100-2, or may provide data stored in the first and second semiconductor chips 1100-1 and 1100-2 to the outside. For example, the bump structure BS may have a pillar structure, a ball structure, or a solder layer.

In some embodiments, the semiconductor package 1100P may include the bump structure BS for a connection with an external device (for example, a printed circuit board or an interposer).

The first semiconductor chip 1100-1 may be arranged such that the top surface of the first semiconductor chip 1100-1 faces the top surface of the second semiconductor chip 1100-2. The first semiconductor chip 1100-1 may be electrically connected to the second semiconductor chip 1100-2 via the bonding pad 130A.

In addition, the polymer layer 140A may be between the first semiconductor chip 1100-1 and the second semiconductor chip 1100-2, and accordingly, the first semiconductor chip 1100-1 and the second semiconductor chip 1100-2 may be combined (coupled) to each other while maintaining a very strong bonding force. The polymer layer 140A may surround the bonding pad 130A, as illustrated.

Figure 12:
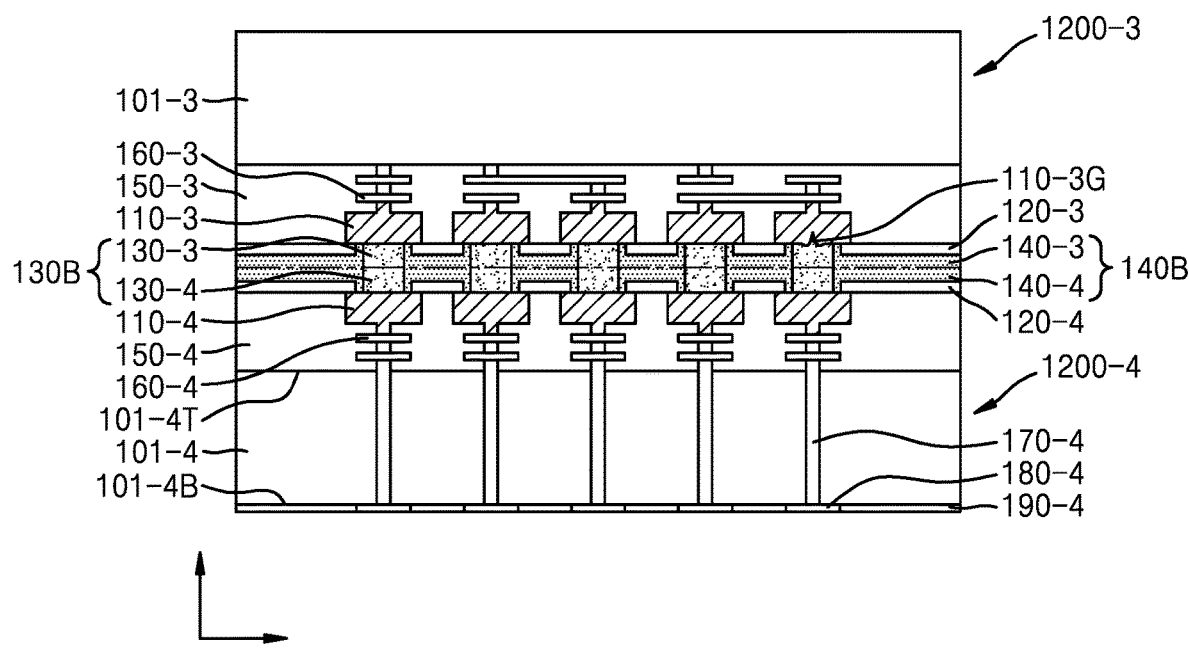
FIG. 12 is a cross-sectional view illustrating a semiconductor package according to an embodiment of the inventive concept.

FIG. 12 is a cross-sectional view illustrating a semiconductor package 1200P according to the technical idea of the inventive concept.

Most of the components constituting the semiconductor package 1200P and materials included in the components to be described below may be substantially the same as or similar to those described with reference to FIG. 11. Accordingly, for convenience of description, descriptions focused on differences from the semiconductor package 1100P (refer to FIG. 11) described above are given below.

Referring to FIG. 12, the semiconductor package 1200P may form a direct bonding structure by using a third semiconductor chip 1200-3, a fourth semiconductor chip 1200-4, the bonding pad 130B and the polymer layer 140B.

The third semiconductor chip 1200-3 may be manufactured from the die 100-3 described above, and the fourth semiconductor chip 1200-4 may be manufactured from the wafer 100-4 described above. Accordingly, since most of the components constituting the third and fourth semiconductor chips 1200-3 and 1200-4 are the same as or similar to those described above, only the differences are described below.

The fourth semiconductor chip 1200-4 may include a through electrode 170-4 passing through the fourth substrate 101-4. A bottom bonding pad 180-4 may be in contact with a bottom surface 101-4B of the fourth substrate 101-4 to be connected to the through electrode 170-4. The bottom bonding pad 180-4 may include Cu, but is not limited thereto.

The semiconductor package 1200P may receive a control signal, a power signal, and a ground signal for the operations of the third and fourth semiconductor chips 1200-3 and 1200-4 by the bottom bonding pad 180-4, or receive a data signal to be stored in the third and fourth semiconductor chips 1200-3 and 1200-4, or may provide data stored in the third and fourth semiconductor chips 1200-3 and 1200-4 to the outside. For example, the bottom bonding pads 180-4 may form a direct bonding structure like the bonding pad 130B.

In some embodiments, the semiconductor package 1200P may include the bottom bonding pad 180-4 for direct bonding with other semiconductor chips.

The third semiconductor chip 1200-3 may be arranged such that the top surface of the third semiconductor chip 1200-3 faces the top surface of the fourth semiconductor chip 1200-4. The third semiconductor chip 1200-3 may be electrically connected to the fourth semiconductor chip 1200-4 by the bonding pad 130B.

In addition, the polymer layer 140B may be between the third semiconductor chip 1200-3 and the fourth semiconductor chip 1200-4, and accordingly, the third semiconductor chip 1200-3 and the fourth semiconductor chip 1200-4 may be combined (coupled) with each other while maintaining a very strong bonding force. The polymer layer 140B may surround the bonding pad 130B, as illustrated.

While the inventive concept has been particularly shown and described with reference to embodiments thereof, it will be understood that various changes in form and details may be made therein without departing from the spirit and scope of the following claims.

What is claimed is:

1. A method of forming a substrate bonding structure, the method comprising:
    preparing a first substrate comprising a first metal pad, a first bonding pad on the first metal pad and penetrating a first insulating layer, and a first polymer layer surrounding all side surfaces of the first bonding pad;
    preparing a second substrate comprising a second metal pad, a second bonding pad on the second metal pad and penetrating a second insulating layer, and a second polymer layer surrounding all side surfaces of the second bonding pad; and
    bonding the first substrate and the second substrate such that the first bonding pad contacts the second bonding pad and the first polymer layer contacts the second polymer layer.

2. The method of claim 1, wherein, in the bonding of the first substrate and the second substrate, the first polymer layer on the first substrate is coupled to the second polymer layer on the second substrate to form a polymer layer.

3. The method of claim 2, wherein the polymer layer entirely surrounds a side surface of the first insulating layer, a side surface of the second insulating layer, and surfaces of the first insulating layer and the second insulating layer facing each other.

4. The method of claim 1, wherein, when viewed in cross-section, a width of the first metal pad is greater than a width of the first bonding pad, and
    a width of the second metal pad is greater than a width of the second bonding pad.

5. The method of claim 1, wherein a material constituting the first and second metal pads is different from a material constituting the first and second bonding pads.

6. The method of claim 1, further comprising, in the preparing of the first substrate, performing a test by contacting the first metal pad with a test pin of a test device.

7. The method of claim 6, wherein the first metal pad comprises a plurality of first metal pads,
    the first bonding pad is not disposed on at least one of the plurality of first metal pads, and
    an uneven portion is formed by the test pin on a surface of the first metal pad in which the first bonding pad is not disposed.

8. The method of claim 7, wherein the first polymer layer fills the uneven portion.

9. The method of claim 6, wherein the first metal pad comprises a plurality of first metal pads,
    the first bonding pad is disposed on all of the plurality of first metal pads, and
    an uneven portion is formed by the test pin on a surface of at least one of the plurality of first metal pads.

10. The method of claim 9, wherein the first bonding pad fills the uneven portion.

11. A manufacturing method of a semiconductor package, the method comprising:
    preparing a first wafer comprising a first metal wiring layer on a first substrate, a first metal pad on the first metal wiring layer, and a first insulating layer on the first metal pad, the first wafer comprising a plurality of individual dies;
    patterning the first insulating layer to expose a top surface of the first metal pad;
    performing a test by contacting the exposed first metal pad with a test pin of a test device;
    forming a mask pattern on the first insulating layer and the first metal pad;
    forming a first bonding pad on a surface of the first metal pad on which the mask pattern is not formed;
    removing the mask pattern;
    forming a first polymer layer covering all of the first insulating layer, the first metal pad, and the first bonding pad;
    exposing the first bonding pad by polishing the first polymer layer;
    separating a first wafer into individual dies by cutting the first wafer; and
    bonding the dies that have been separated to a second wafer,
    wherein each die comprises at least one first bonding pad.

12. The method of claim 11, wherein the second wafer comprises at least one second bonding pad and a second polymer layer, the at least one first bonding pad of the die is bonded to the at least one second bonding pad of the second wafer, and the first polymer layer of the die is bonded to the second polymer layer of the second wafer.

13. The method of claim 11, wherein the first polymer layer is formed to surround all side surfaces of the first bonding pad.

14. The method of claim 11, wherein an area of the first metal pad is formed to be greater than an area of the first bonding pad.

15. The method of claim 11, wherein the performing of the test forms an uneven portion on a surface of the first metal pad that contacts the test pin.

16. The method of claim 15, wherein the first bonding pad is not formed on the first metal pad on which the uneven portion is formed.

17. The method of claim 16, wherein the first polymer layer is formed to fill the uneven portion of the first metal pad.

18. The method of claim 11, wherein the performing of the test determines that a die that has passed the test is good, and determines that a die that has not passed the test is defective.

19. The method of claim 18, wherein at least one die is determined as good and is bonded to the second wafer, after the first wafer is separated into individual dies.

20. The method of claim 19, further comprising:

cutting the second wafer; and separating the cut second wafer into individual semiconductor packages, after the at least one die determined as good has been bonded to the second wafer.

* * * * *